United States Patent
Kwak et al.

(10) Patent No.: US 10,361,351 B2
(45) Date of Patent: Jul. 23, 2019

(54) SEMICONDUCTOR LIGHT EMITTING ELEMENT PACKAGE INCLUDING SOLDER BUMP

(71) Applicant: SAMSUNG ELECTRONICS CO., LTD., Suwon-si (KR)

(72) Inventors: Chang Hoon Kwak, Hwaseong-si (KR); Sung Jin Ahn, Yongin-si (KR); Hak Hwan Kim, Suwon-si (KR); Jin Hwan Kim, Seoul (KR); Jin Kweon Chung, Hwaseong-si (KR); Min Jung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/922,578

(22) Filed: Mar. 15, 2018

(65) Prior Publication Data

US 2019/0067539 A1    Feb. 28, 2019

(30) Foreign Application Priority Data

Aug. 22, 2017   (KR) .................. 10-2017-0106091

(51) Int. Cl.
| | |
|---|---|
| *H01L 33/62* | (2010.01) |
| *H01L 33/50* | (2010.01) |
| *H01L 23/488* | (2006.01) |
| *H01L 23/29* | (2006.01) |
| *H01L 33/36* | (2010.01) |

(52) U.S. Cl.
CPC ............ *H01L 33/62* (2013.01); *H01L 23/293* (2013.01); *H01L 23/488* (2013.01); *H01L 33/36* (2013.01); *H01L 33/50* (2013.01); *H01L 2224/49105* (2013.01)

(58) Field of Classification Search
CPC ..... H01L 33/382; H01L 33/486; H01L 33/62; H01L 2924/181; H01L 2933/0033
See application file for complete search history.

(56) References Cited

U.S. PATENT DOCUMENTS

| | | | |
|---|---|---|---|
| 8,772,807 B2 | 7/2014 | Lin | |
| 8,796,713 B2 | 8/2014 | Lin | |
| 8,963,177 B2 * | 2/2015 | Katsuno | ................ H01L 33/46 257/98 |
| 9,431,583 B2 | 8/2016 | Kim et al. | |

(Continued)

FOREIGN PATENT DOCUMENTS

| | | | |
|---|---|---|---|
| JP | 5500732 B2 | 5/2014 | |
| JP | 5721894 B2 | 5/2015 | |

(Continued)

*Primary Examiner* — Dung A. Le
(74) *Attorney, Agent, or Firm* — Sughrue Mion, PLLC

(57) ABSTRACT

A semiconductor light-emitting diode (LED) package is provided and includes a semiconductor LED chip having a surface on which a first electrode and a second electrode are formed; a first solder bump formed on the first electrode and a second solder bump formed on the second electrode, the first solder bump and the second solder bump protruding from the surface of the semiconductor LED chip; and a resin layer having a bottom portion that surrounds a first side surface of the first solder bump and a second side surface of the second solder bump and covers the surface of the semiconductor LED chip.

17 Claims, 16 Drawing Sheets

(56) References Cited

U.S. PATENT DOCUMENTS

| | | | |
|---|---|---|---|
| 9,691,945 B2 | 6/2017 | Kim et al. | |
| 2012/0080702 A1 | 4/2012 | Lin | |
| 2012/0080703 A1 | 4/2012 | Lin | |
| 2015/0200338 A1 | 7/2015 | Kim et al. | |
| 2016/0118551 A1 | 4/2016 | Kim et al. | |
| 2016/0133615 A1* | 5/2016 | Park | H01L 25/16 257/98 |
| 2016/0293810 A1 | 10/2016 | Baike et al. | |
| 2017/0062671 A1 | 3/2017 | Hashimoto et al. | |
| 2018/0175265 A1* | 6/2018 | Kim | H01L 33/60 |
| 2018/0204989 A1* | 7/2018 | Aoyagi | H01L 33/60 |

FOREIGN PATENT DOCUMENTS

| | | |
|---|---|---|
| JP | 6094062 B2 | 3/2017 |
| JP | 201750321 A | 3/2017 |
| JP | 6107024 B2 | 4/2017 |
| KR | 101260000 B1 | 5/2013 |
| KR | 101352967 B1 | 1/2014 |
| KR | 101360482 B1 | 2/2014 |
| KR | 101584201 B1 | 1/2016 |
| KR | 101701738 B1 | 2/2017 |

\* cited by examiner

SEMICONDUCTOR LIGHT EMITTING ELEMENT PACKAGE INCLUDING SOLDER BUMP

CROSS-REFERENCE TO RELATED APPLICATION

This application claims priority under 35 U.S.C. § 119 to Korean Patent Application No. 10-2017-0106091, filed on Aug. 22, 2017 in the Korean Intellectual Property Office, the disclosure of which is incorporated by reference herein in its entirety.

BACKGROUND

Devices, articles of manufacture, and methods consistent with the present disclosure relate to a semiconductor light-emitting diode (LED) package including a solder bump, and a method of forming the same.

Semiconductor light-emitting diode (LED) chips are semiconductor elements which generate light in a specific wavelength band by recombining electrons and holes. The semiconductor LED chips have been variously applied to light-emitting devices used in lighting devices, display devices, optical communication devices, and the like due to various advantages such as a long lifetime, low power consumption, high luminance, miniaturization, etc. Semiconductor LED chips are packaged so that a semiconductor LED package is manufactured to emit light of a desired wavelength when electricity is supplied thereto from an external power source. Recently, with the miniaturization and high integration of electronic devices, sizes of light-emitting devices used in the electronic devices are being gradually reduced. Accordingly, research on various techniques for packaging semiconductor LED packages on a chip scale is underway.

SUMMARY

One or more example embodiments provide a chip-scale semiconductor light-emitting diode (LED) package for implementing a low cost, a high yield, and simplified manufacturing/mounting processes.

According to an aspect of an example embodiment, there is provided a semiconductor LED package including a semiconductor LED chip comprising a surface on which a first electrode and a second electrode are formed; a first solder bump formed on the first electrode and a second solder bump formed on the second electrode, the first solder bump and the second solder bump configured to protrude from the surface of the semiconductor LED chip; and a resin layer comprising a bottom portion that surrounds a first side surface of the first solder bump and a second side surface of the second solder bump and covers the surface of the semiconductor LED chip.

According to another aspect of an example embodiment, there is provided a method of manufacturing a semiconductor LED package including forming a plurality of semiconductor LED chips on a wafer, each semiconductor LED chip of the plurality of semiconductor LED chips comprising a first electrode and a second electrode provided on a surface of the semiconductor LED chip; forming a first solder bump on the first electrode and a second solder bump on the second electrode, of each of the plurality of semiconductor LED chips, such that the first solder bump and the second solder bump protrude from the surface of the semiconductor LED chip; planarizing a first upper surface of the first solder bump and a second upper surface of the second solder bump on each of the plurality of semiconductor LED chips on the wafer; dicing the plurality of semiconductor LED chips from the wafer to form a plurality of individualized semiconductor LED chips; facing the first solder bump and the second solder bump of each of the plurality of individualized semiconductor LED chips upward and arranging the plurality of individualized semiconductor LED chips on a wavelength conversion layer; attaching a molding tape, in which an adhesive layer is formed, on the first solder bump and the second solder bump of each of the plurality of individualized semiconductor LED chips, embedding a first end portion of the first solder bump and a second end portion of the second solder bump in the adhesive layer, and exposing a first side surface of the first solder bump and a second side surface of the second solder bump; injecting a resin material into a space between the wavelength conversion layer and the molding tape through a transfer molding, and forming a resin layer comprising a bottom portion that surrounds the first side surface and the second side surface and covers the surface of each of the plurality of individualized semiconductor LED chips, and a side wall portion that covers a plurality of chip side surfaces of the plurality of individualized semiconductor LED chips and is coupled to the wavelength conversion layer; and separating the molding tape from the first solder bump and the second solder bump of each of the plurality of individualized semiconductor LED chips and dicing the resin layer and the wavelength conversion layer at a predetermined interval so that the plurality of individualized semiconductor LED chips are separated into a plurality of individual semiconductor LED packages, wherein, for each of the plurality of individualized semiconductor LED packages, the first solder bump includes a first flat upper surface and the second solder bump includes a second flat upper surface, which are formed by planarized and protruded portions which are not covered by the resin layer due to the first end portion of the first solder bump and the second end portion of the second solder bump being buried in the adhesive layer.

According to yet another aspect of an example embodiment, there is provided a method of manufacturing a semiconductor LED package including forming a plurality of semiconductor LED chips on a wafer, each of the plurality of semiconductor LED chips comprising one surface, on which a first electrode and a second electrode are formed; forming a first solder bump on the first electrode and a second solder bump on the second electrode, of each of the plurality of semiconductor LED chips, such that the first solder bump and the second solder bump protrude from the one surface; planarizing a first upper surface of the first solder bump and a second upper surface of the second solder bump of each of the plurality of semiconductor LED chips on the wafer; dicing the plurality of semiconductor LED chips from the wafer to form a plurality of individualized semiconductor LED chips; facing the first solder bump and the second solder bump of each of the plurality of individualized semiconductor LED chips upward and arranging the plurality of individualized semiconductor LED chips on a wavelength conversion layer; injecting a liquid resin material on the wavelength conversion layer so that the liquid resin material has a lower height than an end portion of each of the first solder bump and the second solder bump by dispensing, and forming a resin layer comprising a bottom portion that surrounds side surfaces of each of the first solder bump and the second solder bump and covers the one surface of the plurality of semiconductor LED chips, and a side wall portion that covers side surfaces of the plurality of semiconductor LED chips and is coupled to the wavelength conversion layer; and dicing the resin layer and the wavelength conversion layer at a predetermined interval so that the plurality of individualized semiconductor LED chips are separated into a plurality of individualized semiconductor LED packages, wherein the first solder bump and the second solder bump each includes a flat upper surface formed by planarized and protruded portions which are not covered by the bottom portion of the resin layer.

According to yet another aspect of an example embodiment, there is provided a method of manufacturing a semiconductor LED package including forming a plurality of semiconductor LED chips comprising one surface, on which a first electrode and a second electrode are formed, on a wafer; forming a first solder bump on the first electrode and a second solder bump on the second electrode, of each of the plurality of semiconductor LED chips, to protrude from the one surface; planarizing a first upper surface of the first solder bump and a second upper surface of the second solder bump, of each of the plurality of semiconductor LED chips, on the wafer; dicing the plurality of semiconductor LED chips from the wafer to form a plurality of individualized semiconductor LED chips; facing the first solder bump and the second solder bump of each of the plurality of individualized semiconductor LED chips upward and arranging the plurality of individualized semiconductor LED chips on an adhesive tape; attaching a molding tape, in which an adhesive layer is formed, to the first solder bump and the second solder bump of each of the plurality of individualized semiconductor LED chips, embedding end portions of the first solder bump and the second solder bump of each of the plurality of individualized semiconductor LED chips in the adhesive layer, and exposing a first side surface of the first solder bump and a second side surface of the second solder bump of each of the plurality of individualized semiconductor LED chips; injecting a resin material into a space between the adhesive tape and the molding tape through transfer molding, and forming a resin layer comprising a bottom portion that surrounds the first side surface and the second side surface and covers the one surface of each of the plurality of individualized semiconductor LED chips, and a side wall portion that covers a plurality of side surfaces of the plurality of individualized semiconductor LED chips and is coupled to a wavelength conversion layer; transferring the first solder bump and the second solder bump on a substrate so that the first solder bump and the second solder bump of each of the plurality of individualized semiconductor LED chips face downward while the molding tape is attached to the first solder bump and the second solder bump of each of the plurality of individualized semiconductor LED chips; stacking the wavelength conversion layer on the plurality of individualized semiconductor LED chips or applying the wavelength conversion layer to the plurality of individualized semiconductor LED chips which are arranged on the molding tape, and forming the wavelength conversion layer coupled to the side wall portion of the resin layer; and dicing the resin layer and the wavelength conversion layer of each of the plurality of individualized semiconductor LED chips at a predetermined interval so that a plurality of individualized semiconductor LED packages are separated, wherein the first solder bump and the second solder bump each include a flat upper surface formed by planarized and protruded portions which are not covered by the resin layer due to the end portions of the first solder bump and the second solder bump being buried in the adhesive layer.

BRIEF DESCRIPTION OF THE DRAWINGS

The above and/or other aspects will become more apparent to those of ordinary skill in the art by describing example embodiments thereof in detail with reference to the accompanying drawings, in which.

DETAILED DESCRIPTION OF EXAMPLE EMBODIMENTS

Hereinafter, configurations of semiconductor light-emitting diode (LED) packages 10 and 20 according to example embodiments will be described in detail. An example embodiment may be used in the same sense as one of various embodiments, viewpoints, and aspects of the present inventive concept.

Figure 1A:
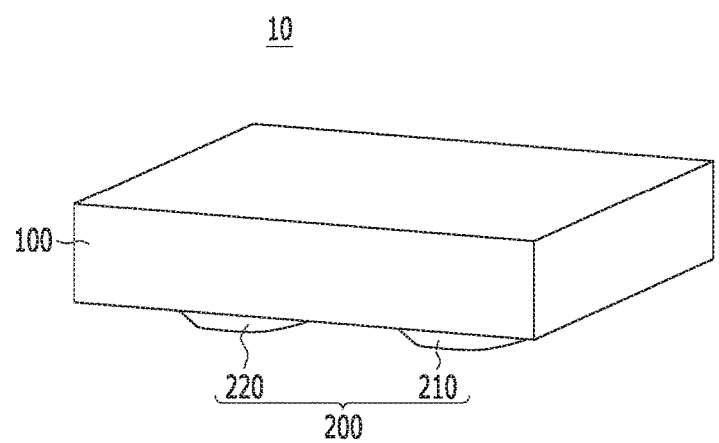
FIG. 1A is a perspective view of a semiconductor light-emitting diode (LED) package (10) according to an example embodiment when viewed from a first surface thereof.
Figure 1B:
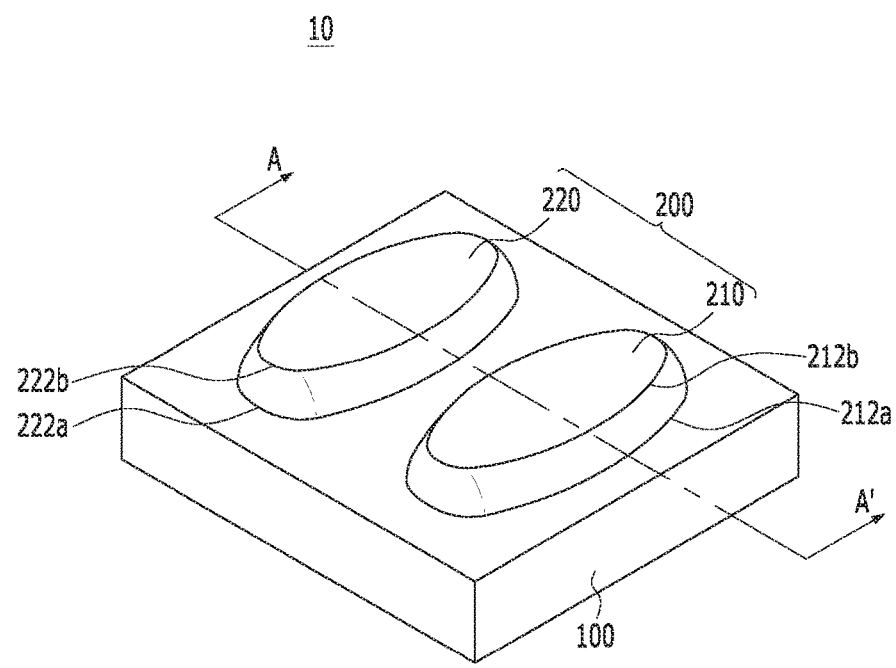
FIG. 1B is a perspective view of the semiconductor LED package (10) of FIG. 1A when viewed from a second surface thereof.
Figure 1C:
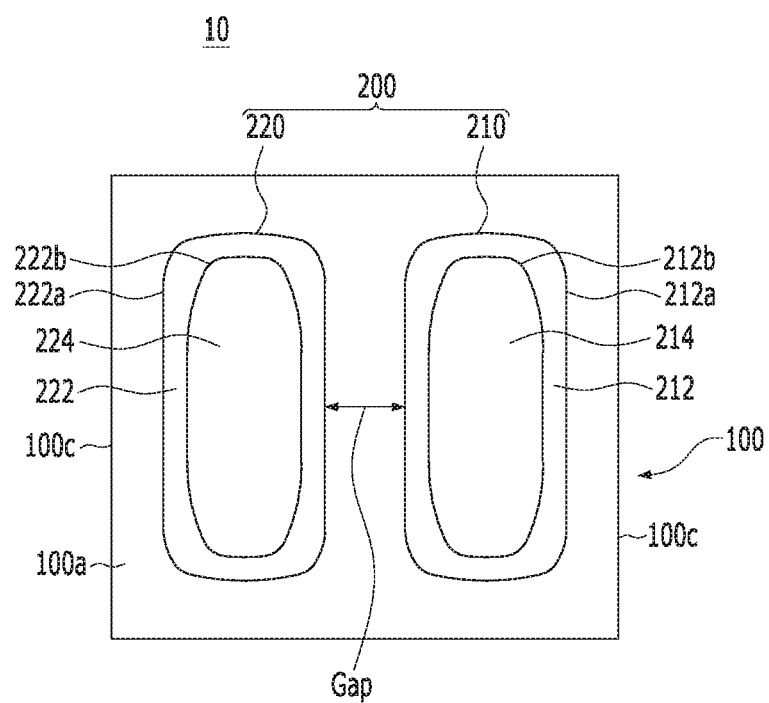
FIG. 1C is a plan view of the semiconductor LED package (10) of FIG. 1A.
Figure 1D:
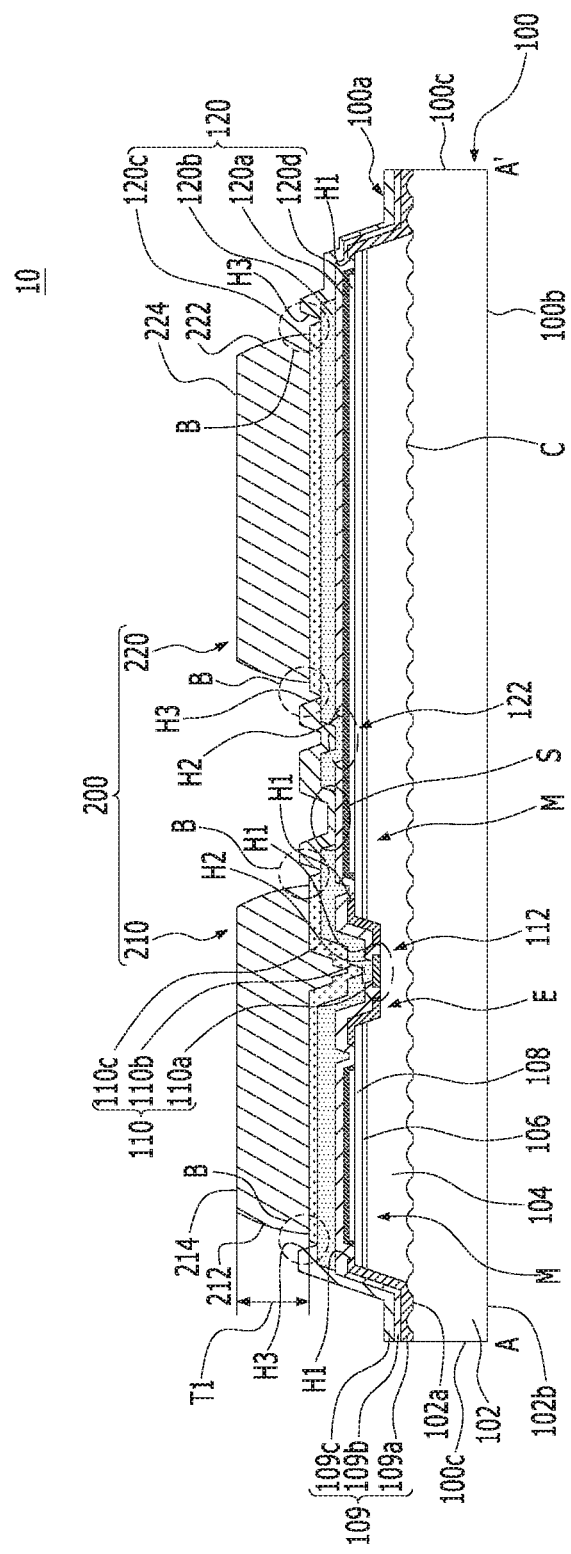
FIG. 1D is a cross-sectional view taken along line A-A' of FIG. 1B.

FIG. 1A is a schematic perspective view of the semiconductor LED package 10 according to an example embodiment when viewed from a first surface thereof, FIG. 1B is a schematic perspective view of the semiconductor LED package 10 of FIG. 1A when viewed from a second surface thereof, FIG. 1C is a schematic plan view of the semiconductor LED package 10 of FIG. 1A, and FIG. 1D is a schematic cross-sectional view taken along line A-A' of FIG. 1B.

Referring to FIGS. 1A to 1D, the semiconductor LED package 10 may include a semiconductor LED chip 100 and a solder bump 200 formed on the semiconductor LED chip 100.

The semiconductor LED chip 100 may be a semiconductor element which converts electric energy into light energy by combining electrons and holes of a compound semiconductor. As best seen in FIG. 1D, the semiconductor LED chip 100 may be a stacked structure including a substrate 102, a first conductive semiconductor layer 104, an active layer 106, and a second conductive semiconductor layer 108, which are sequentially formed on a first surface 102a of the substrate 102, and a first electrode 110 and a second electrode 120 which are respectively connected to the first conductive semiconductor layer 104 and the second conductive semiconductor layer 108.

An insulating substrate, a conductive substrate, or a semiconductor substrate may be used as the substrate 102. The substrate 102 may be formed of a material such as sapphire ($Al_2O_3$), gallium nitride (GaN), silicon (Si), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAl_2$), magnesium aluminum oxide ($MgAl_2O_4$), or the like. In an example embodiment, the substrate 102 for semiconductor growth may be a sapphire substrate. The sapphire substrate 102 may be a crystalline having electrical conductivity and a Hexa-rhombo (R3c) symmetry, having lattice constants of 13.001 Å and 4.758 Å in c-axis and a-axis directions, respectively, and having a c(0001) surface, an m(10-10) surface, an a(11-20) surface, an r(1-102) surface, and the like. Since a nitride thin film is relatively easily grown on the c(0001) surface and the c(0001) surface is stable at a high temperature, the c(0001) surface may be mainly used as a substrate for nitride growth for forming a light-emitting layer. Since a sapphire substrate has optical permeability, light generated from the semiconductor LED chip 100 may be effectively emitted toward the substrate 102 and thus the semiconductor LED chip 100 may be mounted in a flip-chip form.

The substrate 102 may have the first surface 102a and a second surface 102b, which are two surfaces opposite to each other. An uneven structure C for improving light extraction efficiency and high-quality crystal growth may be formed on at least one of the first surface 102a and the second surface 102b of the substrate 102. In an example embodiment, the uneven structure C may be formed on the first surface (a growth surface) 102a of the substrate 102. The uneven structure C may be provided by etching a portion of the substrate 102 or by forming a heterogeneous material layer on the substrate 102.

A buffer layer (not illustrated) may be further selectively formed on the first surface 102a (the growth surface) of the substrate 102. The buffer layer is for improving crystallinity by mitigating lattice mismatch (a lattice constant difference) of a semiconductor layer grown on the substrate 102, and may be formed of an undoped semiconductor layer made of nitride or the like. The buffer layer may be formed of undoped GaN, AlN, InGaN, or the like, and may be formed by being grown at a low temperature of 500° C. to 600° C. to have a thickness of several tens to several hundreds of Å.

The first conductive semiconductor layer 104 may be a semiconductor layer doped with an N-type impurity, and may be a layer which provides electrons to the active layer 106. The second conductive semiconductor layer 108 may be a semiconductor layer doped with a P-type impurity, and may be a layer which provides holes to the active layer 106. In an example embodiment, each of the first and second conductive semiconductor layers 104 and 108 may be a nitride semiconductor which satisfies a composition formula of $Al_xIn_yGa_{(1-x-y)}N$ (where $0 \leq x \leq 1$, $0 \leq y \leq 1$, and $0 \leq x+y \leq 1$), and may be formed of a material such as GaN, AlGaN, InGaN, AlInGaN, or the like. In an example embodiment, the first conductive semiconductor layer 104 may be an Si-doped N-type GaN layer, and the second conductive semiconductor layer 108 may be an Mg-doped P-type GaN layer. In example embodiments, the first and second conductive semiconductor layers 104 and 108 may be stacked with positions thereof switched.

The active layer 106 may emit light having a predetermined wavelength by recombining electrons and holes which are implanted into the first and second conductive semiconductor layers 104 and 108. In an example embodiment, the active layer 106 may be a layer which emits visible light (a wavelength range of about 350 nm to 680 nm) such as blue light, green light, red light, or the like. The active layer 106 may include a material having an energy bandgap smaller than energy bandgaps of the first and second conductive semiconductor layers 104 and 108. The active layer 106 may include a single quantum well (SQW) structure including a quantum well layer and a quantum barrier layer which satisfies a composition formula of $Al_xIn_yGa_{(1-x-y)}N$ ($0 \leq x < 1$, $0 \leq y < 1$, and $0 \leq x+y < 1$) or a multiple quantum well (MQW) structure in which a quantum well layer and a quantum barrier layer are alternately stacked. In an example embodiment, an InGaN/GaN structure may be used as the active layer 106.

A portion of each of the active layer 106 and the second conductive semiconductor layer 108 may be removed by etching so that a portion of an upper surface of the first conductive semiconductor layer 104 may be exposed. A portion of an upper portion of the first conductive semiconductor layer 104 may also be etched so that a portion (an etched surface) of the upper surface of the first conductive semiconductor layer 104 may be located at a lower level than a lower surface of the active layer 106. An etching region E, in which the first conductive semiconductor layer 104 is exposed by etching, and a mesa region M, in which the first and second conductive semiconductor layers 104 and 108 and the active layer 106 are not etched and protrude upward from the etching region E, may be formed on the substrate 102.

The etching region E and/or the mesa region M may be formed in various geometric shapes such as a rectangular shape, a circular shape, an elliptical shape, and the like as necessary. In an example embodiment, the etching region E may be a region obtained by etching and removing an edge region including one edge or one side of the substrate 102, or a region adjacent thereto in a plan view thereof, and the remaining region may be the mesa region M. In an example embodiment, the etching region E may be formed in the form of one or more via holes which are formed in the mesa region M and expose a portion of the first conductive semiconductor layer 104. In an example embodiment, the etching region E may include a finger region having a straight line shape, a curved line shape, or a combination thereof and configured to expose the first conductive semiconductor layer 104 disposed under the mesa region M. The via holes and/or the finger region may have various geometric planar shapes, such as a circular shape, an elliptical shape, a polygonal shape, a straight line shape, a curved line shape, a branch shape, and the like, in a plan view thereof.

The first electrode 110 may be disposed on the first conductive semiconductor layer 104 in the etching region E. The second electrode 120 may be disposed on the second conductive semiconductor layer 108 in the mesa region M. The first and second electrodes 110 and 120 may have a single-layer or multi-layer structure including at least one conductive material of Ag, Al, Ni, Cr, Cu, Au, Pd, Pt, Sn, Ti, W, Rh, Jr, Ru, Mg, Zn, or an alloy thereof.

The first electrode 110 and the second electrode 120 may be electrically separated by an insulating layer 109. The insulating layer 109 may include a first insulating layer 109a in which an opening region H1, which exposes a portion of the upper surface of the first conductive semiconductor layer 104 in the etching region E and a portion of an upper surface of the second conductive semiconductor layer 108 in the mesa region M, is formed.

In an example embodiment, an ohmic contact layer 120d may be formed on the upper surface of the second conductive semiconductor layer 108 in the mesa region M opened by the opening region H1 of the first insulating layer 109a. The ohmic contact layer 120d may have a single-layer or multi-layer structure including at least one of indium tin oxide (ITO), ZnO, a griffin layer, and a material such as Ag, Ni, Al, Rh, Pd, Jr, Ru, Mg, Zn, Pt, Au, and the like. The ohmic contact layer 120d may be disposed to fully cover the upper surface of the second conductive semiconductor layer 108 in consideration of a characteristic of the second conductive semiconductor layer 108 having a relatively large electrical resistance. An ohmic contact layer may also be provided on the first conductive semiconductor layer 104 in the etching region E for more uniform current injection. The ohmic contact layer provided on the first conductive semiconductor layer 104 may include a finger shape having a straight line shape, a curved line shape, or a combination thereof.

A single-layer or multi-layered cover metal layer 120a including the above-described conductive material may be further disposed on the ohmic contact layer 120d. The cover metal layer 120a may have a greater surface area than the ohmic contact layer 120d to fully cover the ohmic contact layer 120d. The ohmic contact layer 120d and/or the cover metal layer 120a may contribute to luminous efficiency in a direction of the substrate 102 by employing a highly reflective material and/or structure as necessary.

A contact metal layer 110a may be formed on the upper surface of the first conductive semiconductor layer 104 in the etching region E opened by the opening region H1 of the first insulating layer 109a. The contact metal layer 110a may have a single-layer or multi-layer structure including the above-described conductive material.

A second insulating layer 109b may be formed on the first insulating layer 109a to fully cover an upper surface of the substrate 102. For example, the second insulating layer 109b may fully cover the first surface 102a of the substrate 102. An opening region H2 may be formed in the second insulating layer 109b to expose a portion of an upper surface of the contact metal layer 110a formed on the first conductive semiconductor layer 104 and a portion of an upper surface of the cover metal layer 120a formed on the second conductive semiconductor layer 108.

A first intermediate metal layer 110b and a second intermediate metal layer 120b having a single-layer or multi-layer structure including the above-described conductive material may be formed on the second insulating layer 109b. The first intermediate metal layer 110b may be formed to fill the opening region H2 of the second insulating layer 109b formed on the first conductive semiconductor layer 104 in the etching region E. The first intermediate metal layer 110b may include a first contact portion 112 connected to the upper surface of the contact metal layer 110a exposed through the opening region H2 of the second insulating layer 109b. The second intermediate metal layer 120b may be formed to fill the opening region H2 of the second insulating layer 109b formed on the second conductive semiconductor layer 108 in the mesa region M. The second intermediate metal layer 120b may include a second contact portion 122 connected to the upper surface of the cover metal layer 120a exposed through the opening region H2 of the second insulating layer 109b. Each of the first and second intermediate metal layers 110b and 120b may cover a portion of the second surface (a bottom surface when mounting) 100a of the semiconductor LED chip 100. The first and second intermediate metal layers 110b and 120b may be electrically separated by an electrode separation region S in which a metal layer is not formed.

A third insulating layer 109c may be formed on the substrate 102 on which the first and second intermediate metal layers 110b and 120b are formed. An opening region H3 may be formed on the third insulating layer 109c to expose at least a portion of an upper surface of each of the first and second intermediate metal layers 110b and 120b. The third insulating layer 109c along with the first and second insulating layers 109a and 109b may form a passivation layer which covers at least a portion of side surfaces of the semiconductor LED chip 100. The third insulating layer 109c may be formed to fill the electrode separation region S.

A first electrode pad 110c and a second electrode pad 120c having a single-layer or multi-layer structure including the above-described conductive material may be respectively formed on the first and second intermediate metal layers 110b and 120b exposed by the opening region H3 of the third insulating layer 109c. The first and second electrode pads 110c and 120c may be connected to the contact metal layer 110a and the cover metal layer 120a, respectively, through the first and second intermediate metal layers 110b and 120b, respectively, to be electrically connected to the first and second conductive semiconductor layers 104 and 108 thereunder, respectively. The first and second electrode pads 110c and 120c may form uppermost layers of the first and second electrodes 110 and 120. The first and second electrode pads 110c and 120c may have substantially a rectangular pad shape. However, this is only an example and in some example embodiments the pad shape of the first and second electrode pads 110c and 120c may have other shapes. The first electrode pad 110c and/or the second electrode pad 120c may be formed with a single pad or a set of a plurality of partial pads. Each of the first and second electrode pads 110c and 120c may be a under bump metallurgy (UBM) layer for forming a solder bump 200, which will be described below, or may further include a UBM layer.

In an example embodiment, the third insulating layer 109c may cover an edge region of the second surface 100a (the bottom surface when mounting) of the semiconductor LED chip 100 and the electrode separation region S. The third insulating layer 109c may protrude from the first and second electrode pads 110c and 120c to be higher than the first and second electrode pads 110c and 120c. Upper surfaces of the first and second electrode pads 110c and 120c may be located at a lower level than the third insulating layer 109c. The third insulating layer 109c may form the opening region H3 which exposes at least a portion of the upper surface of each of the first and second electrode pads 110c and 120c. A first solder bump 210 and a second solder bump 220 may be respectively formed on the first and second electrode pads 110c and 120c which are exposed by the opening region H3 of the third insulating layer 109c. That is, the first solder bump 210 may be formed on the first electrode pad 110c and the second solder bump 220 may be formed on the second electrode pad 120c. Lower ends of side surfaces of the first and second solder bumps 210 and 220 formed in the opening region H3 of the third insulating layer 109c may be surrounded by the third insulating layer 109c which protrudes to be higher than the first and second electrode pads 110c and 120c. The third insulating layer 109c may function as an insulating dam which electrically separates the first and second solder bumps 210 and 220. The lower ends of the side surfaces of the first and second solder bumps 210 and 220 may be surrounded by the third insulating layer 109c (see region B in FIG. 1D) such that the first and second solder bumps 210 and 220 may be prevented from flowing or leaking from the opening region H3 of the third insulating layer 109c to the outside, and thus defects, such as short-circuits and the like, may be prevented.

Any material may be used as the insulating layer 109 as long as the material has an electrically insulating characteristic, and a material having a low light absorption ratio may be used as the insulating layer 109. The insulating layer 109 may include an oxide or nitride such as $SiO_2$, SiN, $SiO_xN_y$, $TiO_2$, $Si_3N_4$, $Al_2O_3$, TiN, AlN, $ZrO_2$, TiAlN, TiSiN, or the like. The insulating layer 109 may be formed by dispersing light reflective fillers in a light transmissive material, or may be formed to have a light reflective structure in a manner in which a light reflective layer, such as a bragg reflector, is formed, as necessary. At least a portion of upper surfaces or upper portions of the first and second electrodes 110 and 120 may be exposed by the opening region H3 formed on the third insulating layer 109c. At least a portion of the upper surfaces or the upper portions of the first and second electrode pads 110c and 120c located at uppermost portions of the first and second electrodes 110 and 120 may be exposed by the opening region H3. The upper surfaces of the first and second electrode pads 110c and 120c may be coplanar.

One surface of the semiconductor LED chip 100 on which the first and second electrode pads 110c and 120c are formed may be the second surface 100a. The second surface 100a of the semiconductor LED chip 100 may include an upper surface of the insulating layer 109 formed on the bottom surface 100a (a surface opposite the substrate 102) of the semiconductor LED chip 100 and/or the upper surfaces of the first and second electrode pads 110c and 120c. The other surface of the semiconductor LED chip 100 may be the first surface 100b (a light-emitting surface). The semiconductor LED chip 100 may further include side surfaces 100c which extend between the one surface (also denoted as a "bottom surface") 100a thereof and the other surface (also denoted as a "light emitting surface") 100b. In an example embodiment, the semiconductor LED chip 100 may have substantially a parallelepiped shape, and may include two surfaces 100a and 100b and four side surfaces 100c. Although the semiconductor LED package 10 according to an example embodiment of the present inventive concept is described with reference to the semiconductor LED chip 100 having the above-described configuration as only an example for facilitating understanding of the present inventive concept, it should be understood that various types of semiconductor light-emitting device chips having similar or different configurations may also be employed.

As discussed above, the first and second solder bumps 210 and 220 may be respectively disposed on the first and second electrode pads 110c and 120c which are formed on the second surface 100a of the semiconductor LED chip 100. The first and second solder bumps 210 and 220 may be electrically connected to the first and second conductive semiconductor layers 104 and 108, respectively, through the first and second electrodes 110 and 120 formed thereunder, respectively. The first and second solder bumps 210 and 220 may be electrical connection terminals for receiving a current from an external power source and supplying the current to the semiconductor LED 100. The first and second solder bumps 210 and 220 may be formed to cover at least a portion of the upper surface of the first and second electrode pads 110c and 120c.

The first and second solder bumps 210 and 220 may be formed in various shapes. In an example embodiment, the first and second electrode pads 110c and 120c may have substantially a rectangular or elliptical planar shape which extends in one direction of the second surface 100a of the semiconductor LED chip 100, in a plan view thereof. As shown in FIGS. 1B and 1C, in an example embodiment, the first and second solder bumps 210 and 220 may extend in the same direction. A direction in which the first and second solder bumps 210 and 220 extend may be referred to as a major axis direction, and a direction perpendicular to the major axis direction may be referred to as a minor axis direction. The first and second solder bumps 210 and 220 may be disposed in a form in which two inner sides thereof in the major axis direction face and are spaced apart from each other by an interval Gap (see FIG. 1C). The first and second solder bumps 210 and 220 may be spaced a sufficient interval from each other to prevent the two bumps from being connected to each other in consideration of a flow when reflowing. The interval G between the first and second solder bumps 210 and 220 may be set in consideration of an area of the second surface 100a (the bottom surface) of the semiconductor LED chip 100. In an example embodiment, when a chip having a size of 1,550 μm×1,550 μm is used, the interval G between the first and second solder bumps 210 and 220 may be set to be in a range of approximately 200 μm to approximately 250 μm.

Areas of the first and second solder bumps 210 and 220 may be in a range of about 70% of an area of the semiconductor LED chip 100 to about 90% thereof in a plan view thereof. As the areas of the first and second solder bumps 210 and 220 are set to be 70% or more of the area of the semiconductor LED chip 100, sufficient heat dissipation through the first and second solder bumps 210 and 220 may be secured. As the areas of the first and second solder bumps 210 and 220 are set to be 90% or less of the area of the semiconductor LED chip 100, a short-circuit defect between the first and second solder bumps 210 and 220 may be prevented. These percent areas are only an example, and the percent area of the chip 100 taken by the first and second solder bumps 210 and 220 may be set variously as long as sufficient heat dissipation may be maintained while ensuring that short-circuit defects are prevented.

In an example embodiment, the first and second solder bumps 210 and 220 may have a cross-sectional contour including protruding side surfaces 212 and 222 having convex surfaces which are inclined with respect to the second surface 100a of the semiconductor LED chip 100 and upper surfaces 214 and 224 (end surfaces) which connect the side surfaces 212 and 222. For example, the first solder bump 210 may have a first side surface 212 and a first upper surface 214, and the second solder bump 220 may have a second side surface 222 and a second upper surface 224 as shown in FIG. 1C. The first upper surface 214 and the second upper surface 224 may each be flat, and in such a case may alternatively be referred to as a first flat upper surface 214 and a second flat upper surface 224. Diameters or surface areas of the first and second solder bumps 210 and 220 may decrease from base ends 212a, 222a thereof toward front ends 212b, 222b thereof in a protruding direction. Diameters or surface areas of the front ends 212b, 222b of the first and second solder bumps 210 and 220 which project from the second surface 100a of the semiconductor LED chip 100 may be less than the diameters or surface areas of the base ends 212a, 222a of the first and second solder bumps 210 and 220.

In an example embodiment, the first and second solder bumps 210 and 220 may protrude from the second surface 100a of the semiconductor LED chip 100 by a predetermined thickness T1 when viewed from the side surface of the semiconductor LED chip 100. A thickness T1 of each of the first and second solder bumps 210 and 220 in the protruding direction may be approximately 60 μm to approximately 100 μm from the second surface 100a of the semiconductor LED 100. The thickness T1 of each of the first and second solder bumps 210 and 220 in the protruding direction may be the same. Each of the first and second solder bumps 210 and 220 may have a substantially uniform thickness T1. The first upper surface 214 of the first solder bump 210 and the second upper surface 224 of the second solder bump 224 (the end surfaces) may be coplanar.

The first and second solder bumps 210 and 220 may be formed of various solder materials. The first and second solder bumps 210 and 220 may include Au, Ag, Al, Ti, W, Cu, Sn, Ni, Pt, Cr, NiSn, TiW, AuSn, or eutectic metals thereof. In an example embodiment, the first and second solder bumps 210 and 220 may include Sn—Ag—Cu (SAC) solder including Sn, Ag, and Cu components.

In the first and second solder bumps 210 and 220, before a plurality of semiconductor LED chips 100 are individualized from a wafer, a mask may be disposed on the wafer and a solder paste made of a solder material may be applied to each of the first and second electrode pads 110c and 120c of the semiconductor LED chip 100 formed on the wafer in a predetermined shape by screen printing. After the applied solder paste is formed in a bump shape by reflowing, a portion of a protruding end of the solder bump may be planarized, and thus the above-described shape may be formed. In this manner, after the semiconductor LED package 10 in which the first and second solder bumps 210 and 220 are formed is individualized from the wafer, the semiconductor LED package 10 may be attached to a conductive pad formed on a light-emitting device and may be firmly mounted on a mounting surface through reflowing and curing processes together with heating and pressing processes.

Generally, a conventional chip-scale semiconductor LED package has a structure in which a bottom surface of a semiconductor LED chip, on which an Au electrode is formed by plating, is directly exposed, or a structure in which an electrode is formed thickly on the bottom surface of the semiconductor LED chip by Cu plating, and then the entire bottom surface is covered with a resin layer (or a phosphor layer), and then the bottom surface is planarized by grinding until the electrode is exposed. However, such a conventional method has a problem in that the number of dies per wafer (i.e., net die) is reduced during the plating process, a production cost is increased, and a manufacturing process is complex.

By contrast, a semiconductor LED package 10 having the above-described configuration according to an example embodiment uses a wafer process rather than a plating process. In the semiconductor LED package 10 according to an example embodiment, since the first and second solder bumps 210 and 220, which are external connection terminals, are formed on the second surface 100a of the semiconductor LED chip 100 in a wafer process, the number of dies per wafer (i.e., net die) may be increased in comparison to the conventional plating process, and a manufacturing cost may be reduced, and a mounting process may be performed with only flux without any additional solder application process during a surface-mount technology (SMT) process. Since protruding ends of the first and second solder bumps 210 and 220 are processed to be the first and second flat upper surfaces 214 and 224 in the wafer process, a process of grinding and planarizing the solder bumps and the resin layer after the semiconductor LED chip 100, on which the solder bumps are formed, is covered with the resin layer may be omitted, and thus the manufacturing process may be simplified. Further since the first and second flat upper surfaces 214 and 224 of the first and second solder bumps 210 and 220, respectively, are formed in the wafer process, the first and second flat upper surfaces 214 and 224 may be formed with high precision, a surface mounting process of the semiconductor LED package 10 may be performed without twisting or tilting the semiconductor LED package 10 in height when being surface mounted, and the surface mounting process may be performed with high precision so that the solder bumps may be firmly attached to a conductive layer of a mounted substrate while maintaining a suitable shape even after reflowing and curing.

Figure 2A:
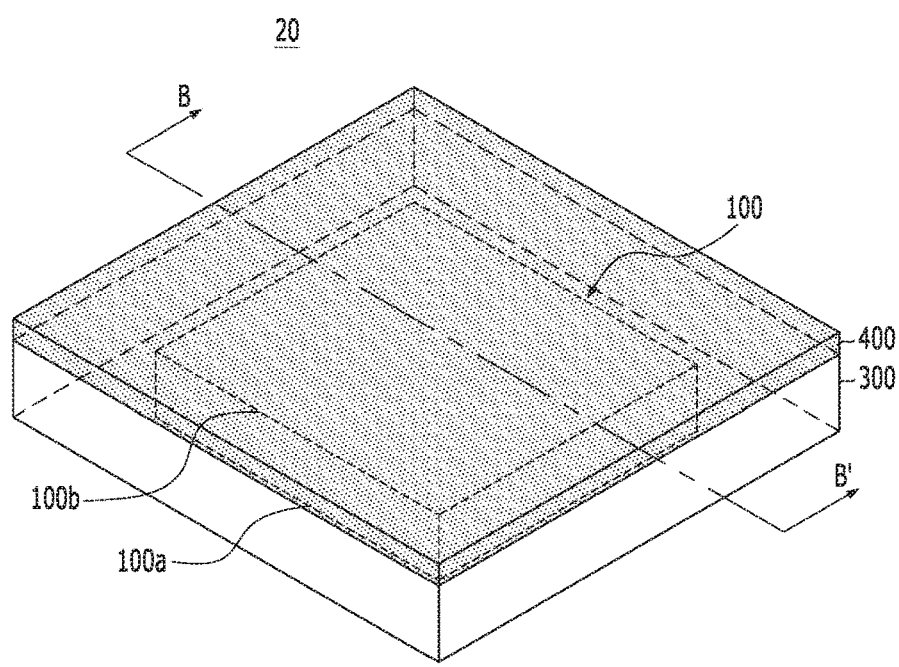
FIG. 2A is a perspective view of a semiconductor LED package (20) according to an example embodiment when viewed from a first surface thereof.
Figure 2B:
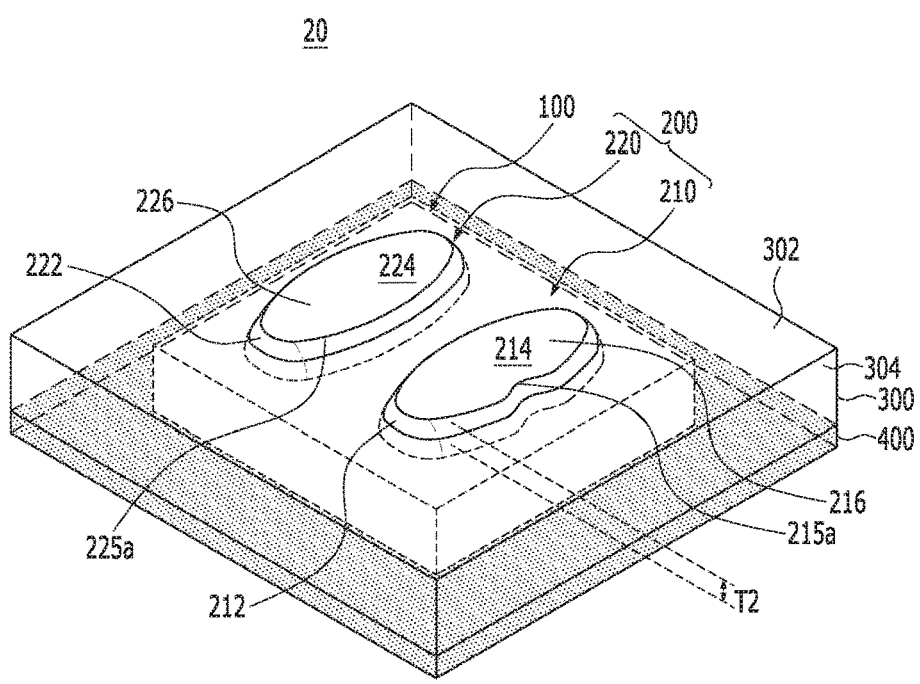
FIG. 2B is a perspective view of the semiconductor LED package (20) of FIG. 2A when viewed from a second surface thereof.

FIG. 2A is a schematic perspective view of a semiconductor LED package 20 according to an example embodiment when viewed from a first surface 100b (i.e., from a light emitting surface of the semiconductor LED package 20), FIG. 2B is a schematic perspective view of the semiconductor LED package 20 of FIG. 2A when viewed from a second surface 100a (i.e., from a bottom surface of the semiconductor LED package 20), and FIGS. 2C to 2I are schematic cross-sectional views taken along line B-B' of FIG. 2A and illustrating various examples of the semiconductor LED package 20 of FIG. 2A.

Referring to FIGS. 2A to 2I, the semiconductor LED package 20 according to an example embodiment may include a semiconductor LED chip 100 and solder bumps 200 having the above-described configuration. Since descriptions thereof are given above in detail, repetitive descriptions will be omitted for conciseness and additional configurations and advantages thereof will be mainly described in detail. The semiconductor LED package 20 according to an example embodiment may further include a resin layer 300 and a wavelength conversion layer 400.

Figure 2C:
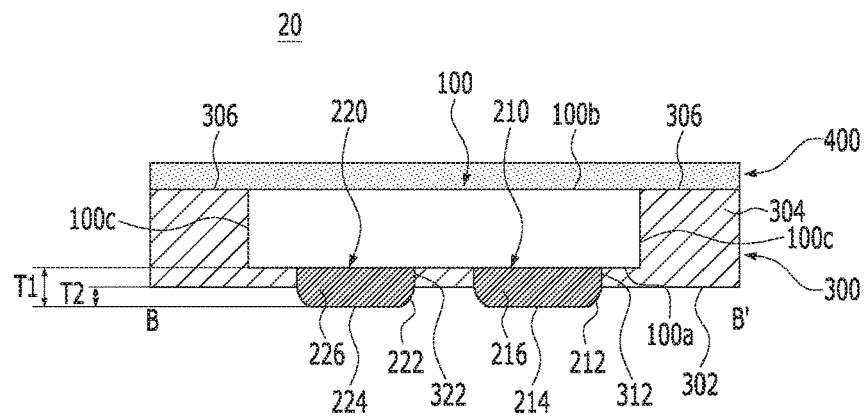
FIGS. 2C to 2I are cross-sectional views taken along line B-B' of FIG. 2A and illustrating various examples of the semiconductor LED package (20) of FIG. 2A.

Referring to FIGS. 2A to 2C, the resin layer 300 may be a member for covering the semiconductor LED chip 100. The resin layer 300 may include a bottom portion 302, which surrounds the first side surface 212 and the second side surface 222 of first and second solder bumps 210 and 220, respectively, and covers a second surface 100a of the semiconductor LED chip 100, and a side wall portion 304 which extends from the bottom portion 302 and covers side surfaces 100c of the semiconductor LED chip 100. The resin layer 300 may be formed by transfer molding, dispensing, or the like. Here, the term "surrounds" may denote that the bottom portion 302 of the resin layer 300 covers a portion of the first and second side surfaces 212, 222, or substantially covers the first and second side surfaces 212, 222.

The bottom portion 302 of the resin layer 300 may be formed to cover the entire second surface 100a of the semiconductor LED chip 100 except for the first and second solder bumps 210 and 220. The bottom portion 302 may fill a space between the first and second solder bumps 210 and 220. Accordingly, when reflowing is performed on the first and second solder bumps 210 and 220 to mount the semiconductor LED package 20 to a mounting surface, bridging between the first and second solder bumps 210 and 220 may be prevented, and thus a short-circuit defect may be prevented.

The bottom portion 302 of the resin layer 300 may be formed to have a thickness less than a thickness T1 of each of the first and second solder bumps 210 and 220 in a protruding direction. Front ends 212b, 222b of the first and second solder bumps 210 and 220 in the protruding direction may protrude from the resin layer 300. The first and second solder bumps 210 and 220 may be exposed without being covered with the resin layer 300. The first and second solder bumps 210 and 220 may include protruding portions 216 and 226 (e.g., a first protruding portion 216 and a second protruding portion 226) which protrude outward from the resin layer 300. The first and second protruding portions 216 and 226 may have a cross-sectional contour including the first and second flat upper surfaces (end surfaces) 214 and 224 and the first and second side surfaces 212 and 222 having inclined convex surfaces, respectively. The first and second protruding portions 216 and 226 may have substantially a uniform thickness T2. The first and second upper surfaces (bottom surfaces when mounting) 214 and 224 of the first and second protruding portions 216 and 226, respectively, may be formed to be flat, and may be coplanar. In an example embodiment, the thickness T2 of each of the first and second protruding portions 216 and 226 may range from approximately 5 μm to approximately 50 μm. Because the thickness T2 of each of the first and second protruding portions 216 and 226 are set to be 5 μm or more, contact areas of electric connection portions, which are formed by the first and second protruding portions 216 and 226 of the first and second solder bumps 210 and 220 respectively when the semiconductor LED package 20 is mounted, may be sufficiently secured. Because the thickness T2 of each of the first and second protruding portions 216 and 226 are set to be 50 μm or less, a thickness of the bottom portion 302 of the resin layer 300 which surrounds the side surfaces 212 and 222 of the first and second solder bumps 210 and 220 may be sufficiently secured, and thus light leakage through the bottom portion 302 of the resin layer 300 may be prevented. The range of the thickness T2 is only an example, and the range of the thickness T2 may be set variously as long as sufficient contact areas of the electric connection portions may be secured while preventing light leakage through the bottom portion 302 of the resin layer 300.

When being surface mounted, the semiconductor LED package 20 may be laterally mounted on a mounting surface with high precision in a state of being separated a predetermined height therefrom by the first and second protruding portions 216 and 226 of the first and second solder bumps 210 and 220 respectively, and a mounting process may be performed with the semiconductor LED package 20 without twisting or tilting the semiconductor LED package 20 in height so that a mounting process may be performed with high precision. The semiconductor LED package 20 is not twisted or tilted in height even when reflowing so that the occurrence of defects due to being twisted or tilted may be prevented. Even when the resin layer 300 is formed by inserting the semiconductor LED chip 100 into a mold and performing transfer molding on the semiconductor LED chip 100, the occurrence of defects, which are caused by the semiconductor light-emitting device chip 100 being twisted, tilted, or broken due to a difference between heights of the first and second solder bumps 210 and 220 when the resin layer 300 is coupled thereto, may be prevented.

Referring to FIG. 2B, in an example embodiment, at least one concave portion 215a which is formed to be inwardly concave may be formed on the first side surface 212 and/or the second side surface 222 of the first solder bump 210 and/or the second solder bump 220, respectively. That is, the first side surface 212 may have a concave portion 215a, and/or the second side surface 222 may have a concave portion 225a. In other words, the concave portion 215a and/or the concave portion 225a may be omitted in some example embodiments. The bottom portion 302 of the resin layer 300 may fill an inside of the concave portion 215. The concave portion 215 may increase a contact area between the second surface 100a and the bottom portion 302 of the semiconductor LED chip 100 and contact areas between the first and second side surfaces 212 and 222 of the first and second solder bumps 210 and 220 and the bottom portion 302 to improve adhesion, and thus delamination or damage of the bottom portion 302 may be prevented. The concave portion 215 may be formed on any portion of the first and second side surfaces 212 and 222 of the first and second solder bumps 210 and 220, respectively. When the concave portion 215 is formed on only one of the first and second solder bumps 210 and 220, for example on only the first solder bump 210, the concave portion 215a may function as an identification mark which may allow positive and negative poles of electrodes to be easily distinguished from each other in external appearance. Alternatively, a convex portion (not illustrated) instead of the concave portion 215 and/or a convex portion along with the concave portion 215 may be formed on the first and second side surfaces 212 and 222 of the first and second solder bumps 210 and 220, respectively.

Figure 2D:
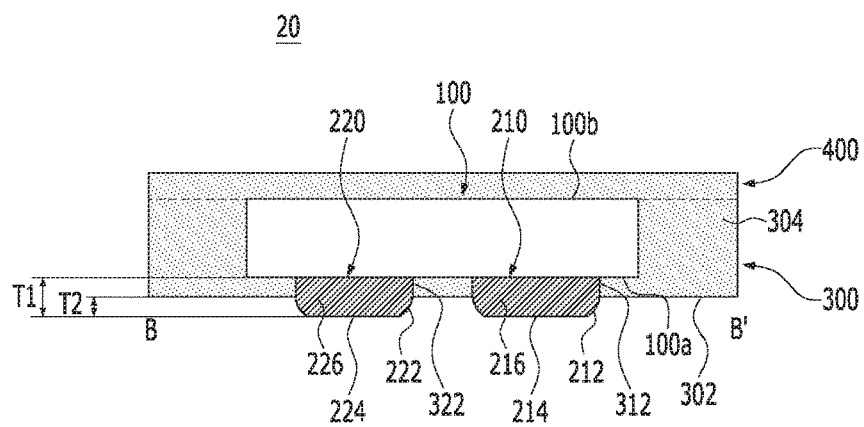
Figure 2E:
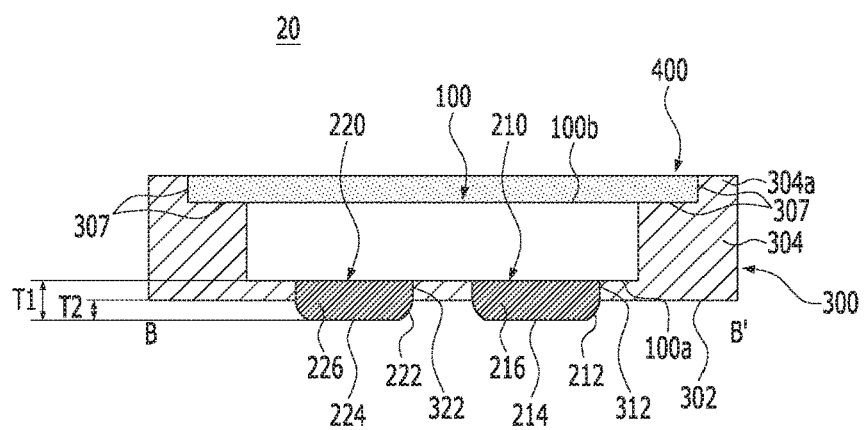
Figure 2F:
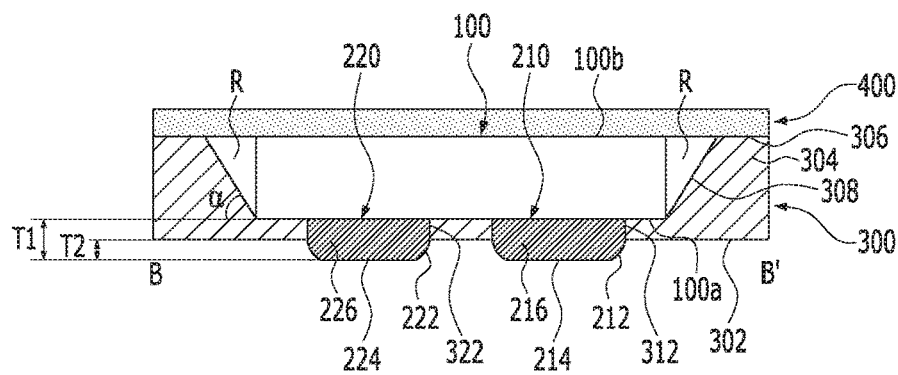
Figure 2G:
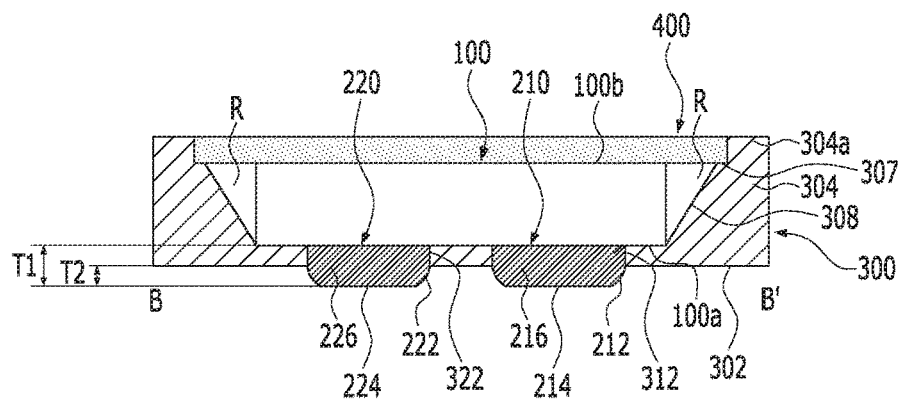
Figure 2H:
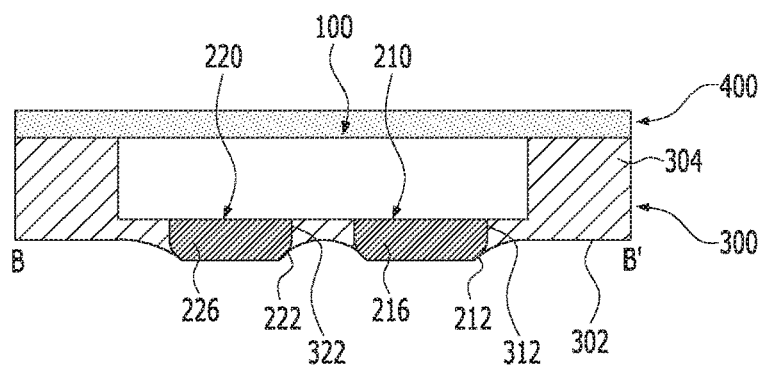
Figure 2I:
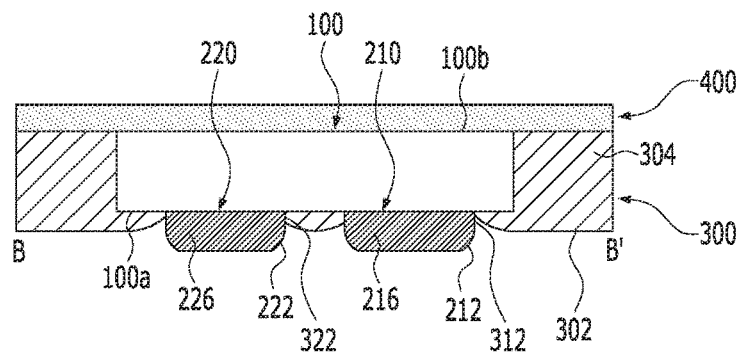

Referring to FIG. 2I, in an example embodiment, the bottom portion 302 of the resin layer 300 may include a first thickness variation portion 312 and a second thickness variation portion 322 which are adjacent to the first and second side surfaces 212 and 222, respectively, of the first and second solder bumps 210 and 220, respectively. Each of the first and second thickness variation portions 312 and 322 may be a portion having a thickness different from or having a step profile with other portions of the bottom portion 302 of the resin layer 300. The first and second thickness variation portions 312 and 322 of the resin layer 300 may be in contact with the first and second side surfaces 212 and 222, respectively, of the first and second solder bumps 210 and 220, respectively. In an example embodiment, the first and second thickness variation portions 312 and 322 may be formed as first and second inclined surfaces, respectively, having a decreased thickness compared to other portions of the bottom portion 302 of the resin layer 300, while being inclined with respect to the second surface 100a of the semiconductor LED chip 100 near the first and second side surfaces 212 and 222, respectively, of the first and second solder bumps 210 and 220, respectively. The first and second inclined surfaces formed by the first and second thickness variation portions 312 and 322, respectively, may have a curved surface shape which is convexly curved toward the first and second side surfaces 212 and 222, respectively, of the first and second solder bumps 210 and 220, respectively. When the semiconductor LED package 100 is reflowed and cured for surface mounting, since the first and second solder bumps 210 and 220 are formed to have substantially a thin pillar shape which, when reflowed and cured, may expand in a direction toward the first and second thickness variation portions 312 and 322 of the resin layer 300 and cover the first and second thickness variation portions 312 and 322, the first and second solder bumps 210 and 220 connected to conductive pads of a mounting substrate may be formed as solder bumps having a large surface area and a suitable shape that does not concentrate stress.

Referring to FIG. 2H, in an example embodiment, the first and second thickness variation portions 312 and 322 of the resin layer 300 may be formed as first and second inclined surfaces, respectively, having an increased thickness near the first and second side surfaces 212 and 222, respectively, of the first and second solder bumps 210 and 220, respectively. The first and second inclined surfaces formed by the first and second thickness variation portions 312 and 322 may have a curved surface shape in contact with the first and second side surfaces 212 and 222 of the first and second solder bumps 210 and 220 and concavely curved to follow the shapes of the first and second side surfaces 212 and 222. The first and second thickness variation portions 312 and 322 of the resin layer 300 may have a meniscus shape (as shown in FIG. 2H) rising along the first and second side surfaces 212 and 222, respectively, of the first and second solder bumps 210 and 220 at portions in contact with the first and second side surfaces 212 and 222 of the first and second solder bumps 210 and 220, respectively. Accordingly, contact areas between the first and second thickness variation portions 312 and 322 of the resin layer 300 and the first and second side surfaces 212 and 222, respectively, of the first and second solder bumps 210 and 220, respectively, are enlarged, and thus adhesion therebetween may be improved.

Referring to FIGS. 2B and 2C, the bottom portion 302 of the resin layer 300 may further extend to the outside of the second surface 100a of the semiconductor LED chip 100, and the side wall portion 304 of the resin layer 300 may be disposed on the extended portion. The side wall portion 304 may be disposed adjacent to the side surfaces 100c of the semiconductor LED chip 100 to entirely or partially cover or surround the side surfaces 100c of the semiconductor LED chip 100. In an example embodiment, the side wall portion 304 may have a thickness covering the entire side surface 100c of the semiconductor LED chip 100 (as shown in FIG. 2C), and may be formed to have a thickness of approximately 200 μm to approximately 250 μm. In an example embodiment, an end surface 306 of the side wall portion 304 may be located at the same level as the first surface 100b of the semiconductor LED chip 100, and the end surface 306 of the side wall portion 304 and the first surface 100b of the semiconductor LED chip 100 may be substantially coplanar. In some example embodiments, the side wall portion 304 may have a thickness covering only a portion of the side surfaces 100c of the semiconductor LED chip 100.

The resin layer 300 may be formed of silicone or a thermosetting resin material such as epoxy or the like. In an example embodiment, the resin layer 300 may be formed to function as a reflective resin layer illustrated in FIGS. 2A to 2C by mixing the resin material with a high reflectance material such as $SiO_2$, $SiN$, $SiO_xN_y$, $TiO_2$, $Si_3N_4$, $Al_2O_3$, $TiN$, $AlN$, $ZrO_2$, $TiAlN$, $TiSiN$, or the like. The reflective resin layer may reflect side light emitted from the semiconductor LED chip 100, and thus luminous efficiency may be improved.

The wavelength conversion layer 400 may be a layer which is disposed on a path of light emitted from the semiconductor LED chip 100 and converts a wavelength of the light. The wavelength conversion layer 400 may be disposed to cover at least a portion of the first surface (i.e., a light emitting surface) 100b and/or at least a portion of the side surface 100c of the semiconductor LED chip 100. In an example embodiment, the wavelength conversion layer 400 may be disposed and coupled to the end surface 306 of the side wall portion 304 of the resin layer 300 to cover the entire first surface 100b of the semiconductor LED chip 100 (See, e.g., FIG. 2C).

Referring to FIGS. 2E to 2G, in an example embodiment, the side wall portion 304 of the resin layer 300 may include an extension portion 304a which extends from an edge of the side wall portion 304 toward the wavelength conversion layer 400. The wavelength conversion layer 400 may be inserted into the extension portion 304a and may be disposed on a stepped surface 307 between the side wall portion 304 and the extension portion 304a to cover the first surface (i.e., the light-emitting surface) 100b of the semiconductor LED chip 100. In an example embodiment, for example as shown in FIG. 2F, an inclined surface 308 having a shape, which faces the semiconductor LED chip 100 and whose diameter increases toward the wavelength conversion layer 400, may be formed on an inner side surface of the side wall portion 304 of the resin layer 300. In an example embodiment, an angle α (see FIG. 2F) of the inclined surface may range from about 40° to about 65°. Therefore, a beam spread angle of the light emitted from the semiconductor LED chip 100 may be optimally formed. In an example embodiment, the side wall portion 304 may include both the inclined surface 308 and the extension portion 304a, as shown in FIG. 2G. In an example embodiment, a resin material for sealing the semiconductor LED chip 100 and protecting the semiconductor LED chip 100 from external foreign substances may fill a space R between the inclined surface 308 of the side wall portion 304 of the resin layer 300 and the semiconductor LED chip 100. The resin material may be a transparent resin such as silicone or a resin containing a fluorescent material. The resin material may be formed to fully cover the semiconductor LED chip 100 by dispensing. Instead of the wavelength conversion layer 400, a wavelength conversion layer may be formed by adding a wavelength conversion material to the resin material. According to various example embodiments, the wavelength conversion material may be uniformly dispersed in the resin material, or may be deposited in the resin material and conformally cover the first surface 100b and the side surfaces 100c of the semiconductor LED chip 100.

Referring to FIG. 2D, in an example embodiment, the resin layer 300 may be formed of the same material as the wavelength conversion layer 400, or may function as a wavelength conversion layer by adding another wavelength conversion material to the a material of the resin layer 300. The wavelength conversion layer 400 and the resin layer 300 may be integrally combined to fully cover and/or surround the semiconductor LED chip 100. Accordingly, as wavelengths of most light including the side light emitted from the semiconductor LED chip 100 are converted, it is possible to suppress generation of light of which a wavelength is not converted and emitted, and to improve color reproducibility. The resin layer 300 may be formed separately from the wavelength conversion layer 400 and integrated therewith, or may be integrally molded with the same material thereas.

The wavelength conversion layer 400 may have substantially a uniform thickness. In the present inventive concept, the term "substantially" as used in relation to uniform thickness may include a thickness which is not completely uniform with a degree of thickness variation within an error range of a manufacturing process, as well as a completely uniform thickness. In an example embodiment, the thickness of the wavelength conversion layer 400 may range from about 90 μm to about 100 μm.

The wavelength conversion layer 400 may be formed by mixing a light transmitting material with a wavelength conversion material. In an example embodiment, the light transmitting material may include silicone or a thermosetting resin material such as epoxy or the like, and may be a composite material in which a polymer binder such as a curing agent and a curing catalyst is mixed with the thermosetting resin in a semi-cured (B-stage) state. A silanebased material may be added thereto as an additive in order to secure adhesiveness. A phosphor or a quantum dot may be used as the wavelength conversion material. A garnet-based phosphor (YAG, TAG, or LuAG), a silicate-based phosphor, a nitride-based phosphor, a sulfide-based phosphor, an oxide-based phosphor, or the like may be used as the phosphor, and the phosphor may be formed of a single species or a plurality of species mixed at a predetermined ratio. In an example embodiment, when the semiconductor LED chip 100 is a nitride semiconductor which emits blue light, the phosphor may be a garnet-based phosphor which converts blue light into yellow light. A part of the blue light passes through the wavelength conversion layer 400, is converted into yellow light, and is mixed with the blue light, and thus white light emission may be implemented. The wavelength conversion layer 400 may include a single-layer or multi-layer structure made of the above-described material. In an example embodiment, the wavelength conversion layer 400 may be provided in an adherent semi-cured state, and may be formed by being attached to the semiconductor LED chip 100 and the resin layer 300 and heating and curing the same. The wavelength conversion layer 400 may be applied to the resin layer 300 to cover the semiconductor LED 100 by dispensing.

According to the semiconductor LED package 20 having such a configuration, the semiconductor LED package 20 may have the same advantages as the above-described semiconductor LED package 10. In addition, since the first and second solder bumps 210 and 220 include the first and second protruding portions 216 and 226, respectively, which protrude outward a predetermined thickness from the bottom portion 302 of the resin layer 300 and the first and second end surfaces 214 and 224 of the first and second protruding portions 216 and 226, respectively, are formed as flat surfaces, the occurrence of defects, in which the direction of the semiconductor LED package 20 is changed or inclined when a mounting process is performed by reflowing and curing, may be effectively prevented, and the semiconductor LED package 20 may be firmly and precisely attached to the mounting surface by forming solder bumps having a suitable shape and a thickness. Further, a surface of the resin material, which forms the resin layer 300, may exhibit a hard but a weak adhesive property. In other words, the surface of the resin material may be hard, but may also have an adhesive property which is weak. A lowermost end surface of the semiconductor LED package 20 may be the first and second end surfaces 214 and 224 of the first and second protruding portions 216 and 226, which are made of a metal material, and the bottom portion 302 of the resin layer 300 may be spaced from a lowermost end of the semiconductor LED package 20 by the thickness T2 of each of the first and second protruding portions 216 and 226. For example, when semiconductor LED packages 20 accommodated in a carrier tape are unloaded one by one, it is possible to prevent a pickup defect caused by a bottom surface of the resin layer 300 being attached to the carrier tape such that the semiconductor LED package 20 does not easily separate therefrom, or a pickup defect caused by the semiconductor LED package 20 being attached to a tester such that the semiconductor LED package 20 is not easily separated therefrom in the case in which test of the semiconductor LED package 20 is completed in the tester and then picked up, or the like.

Hereinafter, processes of manufacturing the semiconductor LED package 10 and/or 20 according to example embodiments will be described.

FIGS. 3A to 3E are views schematically illustrating a process of manufacturing the semiconductor LED package 10 (a bump chip) in which first and second solder bumps 210 and 220 are formed on a semiconductor LED chip 100.

Figure 3A:
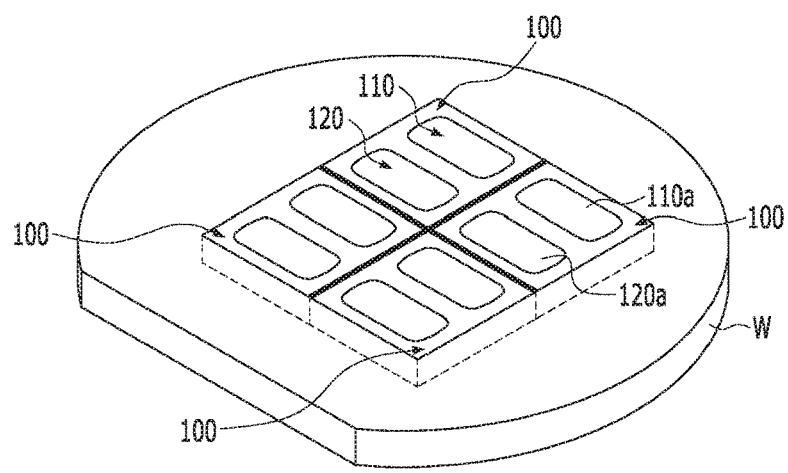
FIGS. 3A to 3E are views illustrating a process of manufacturing the semiconductor LED package (10) according to an example embodiment.

Referring back to FIG. 1D and to FIG. 3A, semiconductor light-emitting layers including a first conductive semiconductor layer 104, an active layer 106, and a second conductive semiconductor layer 108 which are sequentially stacked may be formed on a wafer W, first and second electrodes 110 and 120 may be formed on the first and second conductive semiconductor layers 104 and 108, respectively, and thus a plurality of semiconductor LED chips 100 may be formed. An uneven structure and/or a buffer layer may be formed on a growth surface of the wafer W (a first main surface 102a of a substrate). The semiconductor light-emitting layers may be formed by a chemical or physical vapor deposition process such as a metal organic chemical vapor deposition (MOCVD) process, a hydride vapor phase epitaxy (HVPE) process, a molecular beam epitaxy (MBE) process, or the like. A portion of the deposited semiconductor light-emitting layers may be etched to form an etching region E and a mesa region M. A contact metal layer 110a, a first intermediate metal layer 110b, and a first electrode pad 110c, which are connected to each other through opening regions H1, H2, and H3 formed in first to third insulating layers 109a, 109b, and 109c, may be sequentially stacked, and the first electrode 110 may be formed on the first conductive semiconductor layer 104 exposed in the etching region E. An ohmic contact layer 120d and/or a cover metal layer 120a, a second intermediate metal layer 120b, and a second electrode pad 120c, which are connected to each other through the opening regions H1, H2, and H3 formed in the first to third insulating layers 109a, 109b, and 109c, may be sequentially stacked, and the second electrode 120 may be formed on the second conductive semiconductor layer 108 exposed in the mesa region M. The first and second electrodes 110 and 120 may be electrically insulated by the first to third insulating layers 109a, 109b, and 109c. The first and second electrode pads 110c and 120c located at uppermost portions of the first and second electrodes 110 and 120 may be formed in the opening region H3 of the third insulating layer 109c. An edge of the opening region H3 formed by the third insulating layer 109c may be formed to protrude upward from upper surfaces of the first and second electrode pads 110c and 120c.

Figure 3B:
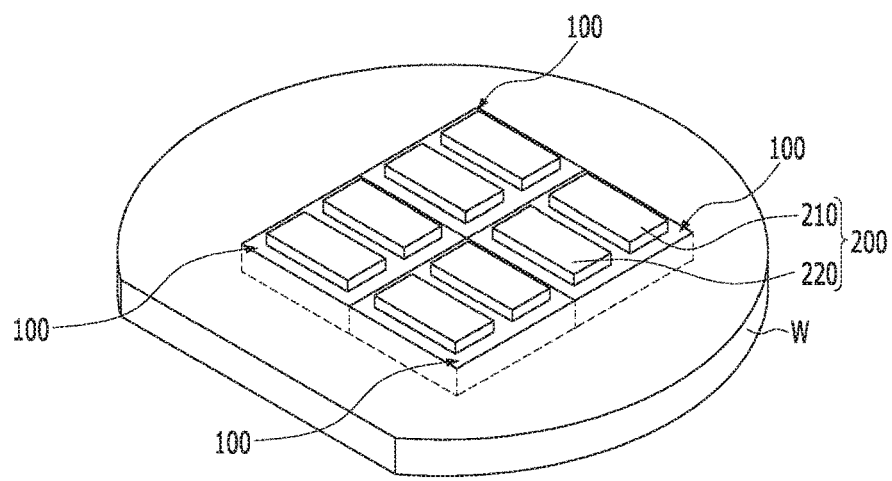
Figure 3C:
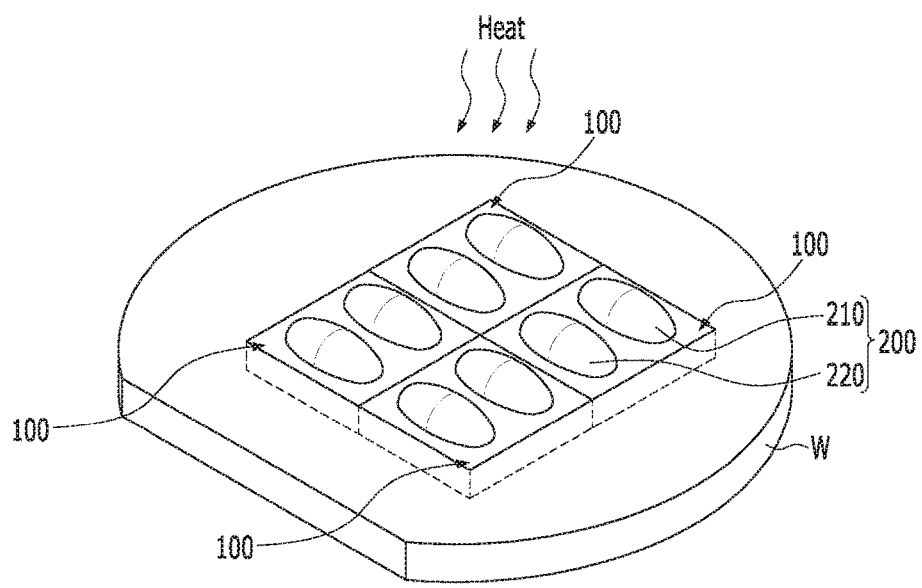
Figure 3D:
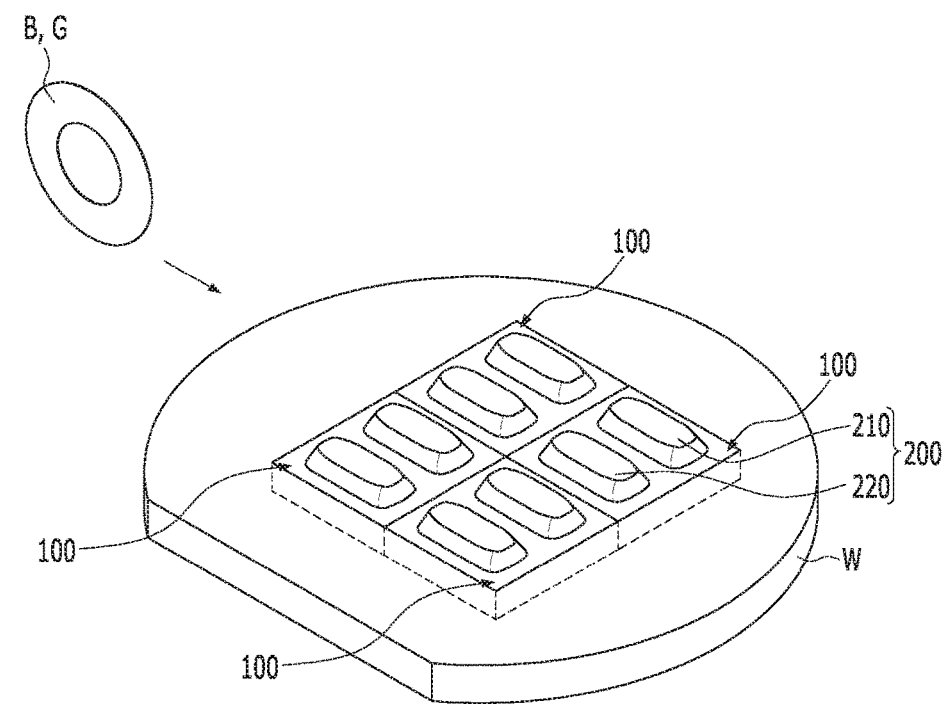

Referring again back to FIG. 1D and to FIGS. 3B to 3D, a mask (not illustrated) may be disposed on the wafer W including the plurality of semiconductor LED chips 100 on which the first and second electrodes 110 and 120 are formed, and a SAC solder paste may be applied to the first and second electrodes pads 110c and 120c exposed in the opening region H3 of the third insulating layer 109c to form the solder bumps 200 (i.e., the first and second solder bumps 210 and 220) having a predetermined thickness. The solder bumps 200 may be reflowed at a temperature of approximately 235° C. to approximately 250° C. to form the solder bumps 200 having substantially a hemispherical shape due to surface tension as shown in FIG. 3C. Thereafter, the first and second solder bumps 210 and 220 having the first and second flat upper surfaces 214 and 224, respectively, at the first and second front ends 212b and 222b, respectively, thereof and including first and second side surfaces 212 and 222, respectively, having inclined and convex surfaces may be formed by planarizing end portions of the solder bumps 200 as shown in FIG. 3D. In an example embodiment, the first and second flat upper surfaces 214 and 224 of the solder bumps 200 may be formed by removing and planarizing a portion of end portions of the solder bumps 200 by surface polishing with a grinder G or by cutting with a blade B. The first and second upper surfaces of the solder bumps 200 may be planarized by pressing the end portions of the solder bumps 200. In an example embodiment, first and second base ends 212a and 222a of first and second side surfaces 212 and 222 of the first and second solder bumps 210 and 220, respectively, may be surrounded by an edge of the opening region H3 of the third insulating layer 109c protruding to be higher than the first and second electrode pads 110c and 120c. Therefore, the above structure may prevent the first and second solder bumps 210 and 220 from flowing or leaking from the opening region H3 of the third insulating layer 109c to the outside, and thus defects, such as short-circuits and the like, may be prevented.

Figure 3E:
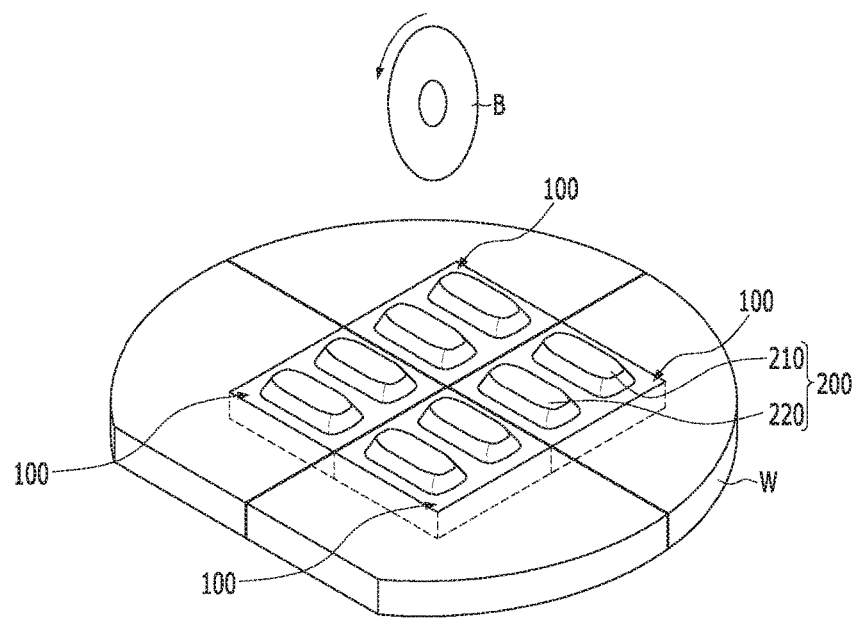

Referring to FIG. 3E, the plurality of semiconductor LED chips 100 may be separated from each other by cutting the wafer W including the plurality of semiconductor LED chips 100, on each of which the first and second solder bumps 210 and 220 are formed, with the blade B, and thus a plurality of semiconductor LED packages 10, in each of which the first and second solder bumps 210 and 220 are formed, may be manufactured.

FIGS. 4A to 4G are views schematically illustrating a process of manufacturing a semiconductor LED package 20 according to an example embodiment, and illustrate an example of the process of manufacturing the semiconductor LED package 20 using a phosphor sheet or film FF as a member for forming a wavelength conversion layer.

Figure 4A:
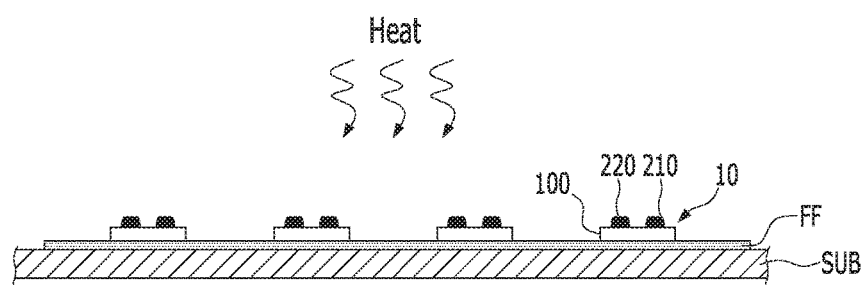
FIGS. 4A to 6F are views illustrating a process of manufacturing the semiconductor LED package (20) according to an example embodiment.

Referring to FIG. 4A, in step S01, an adherable and semi-cured phosphor sheet or the film FF (hereinafter, collectively referred to as a phosphor film FF) may be disposed on a substrate SUB, and a plurality of semiconductor LED chips 100 (hereinafter, referred to as bump chips) in which first and second solder bumps 210 and 220 are formed may be arranged on and attached to the phosphor film FF at regular intervals. The phosphor film FF may be obtained by dispersing the above-described phosphor on silicone or a resin material such as epoxy or the like. In step S02, the phosphor film FF may be heated and cured at a curing temperature or more through a thermal process so that adhesion of the phosphor film FF with the bump chips 100 may be enhanced. The phosphor film FF may be formed by applying a liquid phosphor material to the substrate SUB by dispensing.

Figure 4B:
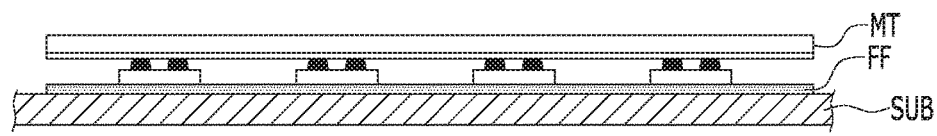

Referring to FIG. 4B, in step S03, a molding tape MT may be attached to the first and second solder bumps 210 and 220 of the plurality of bump chips 100 arranged on the phosphor film FF. In an example embodiment, the molding tape MT may be obtained by forming an acryl-based or silicone-based adhesive layer on a polyethylene terephthalate (PET) substrate. The adhesive layer of the molding tape MT may be recessed by a predetermined thickness to cover first and second flat upper surfaces 214 and 224 (end surfaces) of the first and second solder bumps 210 and 220, respectively, and upper ends of the first and second side surfaces 212 and 222 of the first and second solder bumps 210 and 220. Lower ends of the first and second side surfaces 212 and 222 of the first and second solder bumps 210 and 220 may be exposed without being covered by the adhesive layer of the molding tape MT. A recess depth of the adhesive layer of the molding tape MT may be adjusted by setting a thickness of the adhesive layer to correspond to a thickness T2 of each of first and second protruding portions 216 and 226 of the first and second solder bumps 210 and 220. In an example embodiment, the recess depth may range from approximately 5 μm to approximately 50 μm. Accordingly, the thickness of the adhesive layer may be approximately 5 μm or more.

Figure 4C:
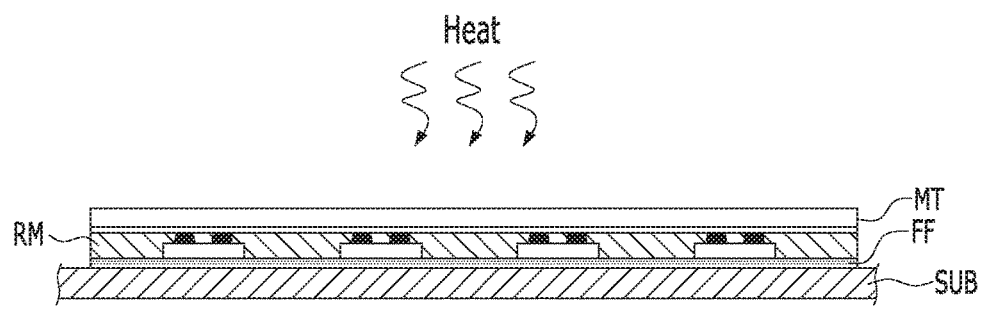
Figure 4D:
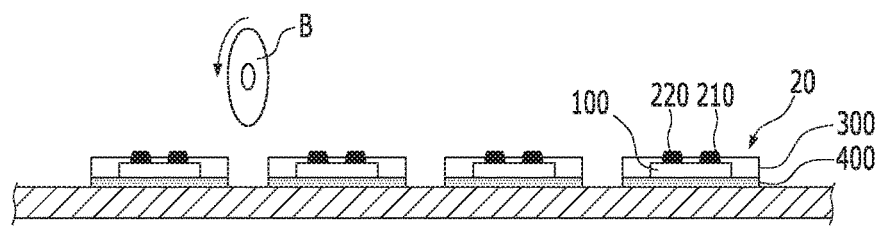
Figure 4E:
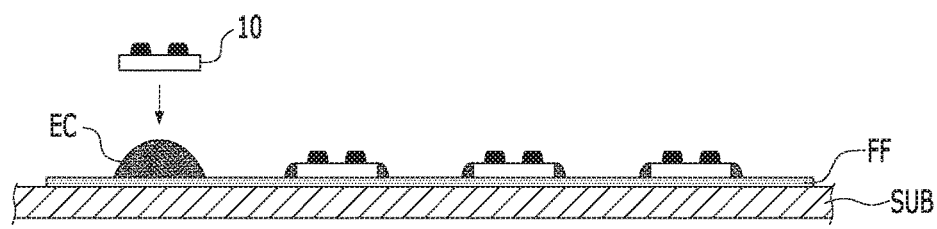
Figure 4F:
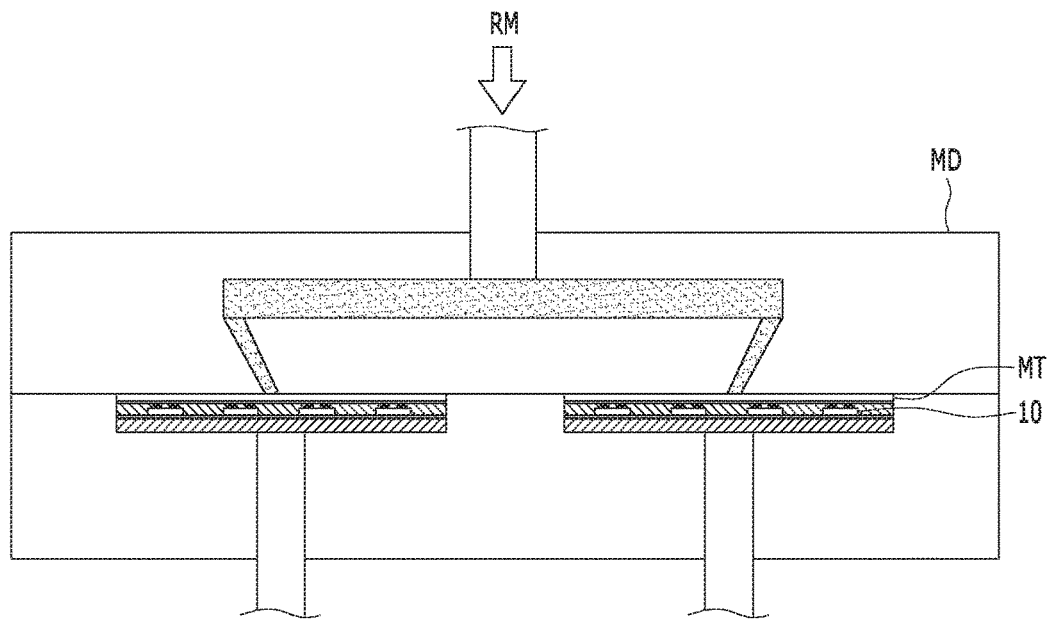

Referring to FIG. 4F, in step S04, the entire substrate SUB on which the plurality of bump chips 100 are disposed may be positioned inside a mold MD in a state in which the molding tape MT is attached thereto, a resin material RM may be injected into the mold MD through a transfer molding process to cover side surfaces 100c and second surfaces 100b of the bump chips 100 and the first and second side surfaces 212 and 222 of the first and second solder bumps 210 and 220, as illustrated most clearly in FIG. 4C, and thus a resin layer 300 including a bottom portion 302, which surrounds the first and second side surfaces 212 and 222 of the first and second solder bumps 210 and 220 and covers the second surfaces 100a of the bump chips 100, and a side wall portion 304, which extends from the bottom portion 302 and covers the side surfaces 100c of the bump chips 100, may be molded, as illustrated in FIGS. 2A to 2I above. After the resin layer 300 is molded, the resin layer 300 may be cured through a thermal process, as shown in FIG. 4C.

In an example embodiment, when a silicone resin to which $TiO_2$ is added is used as the resin material, the resin layer 300 may be implemented as a reflective resin layer, as illustrated in FIG. 2C, and thus luminous efficiency may be improved. In an example embodiment, when a silicone resin to which a phosphor is added is used as the resin material, the resin layer 300 may be implemented as a wavelength conversion layer, as illustrated in FIG. 2D, and thus even side light which does not pass through a wavelength conversion layer 400 may be wavelength-converted by the resin layer 300.

In an example embodiment, the first and second thickness variation portions 312 and 322 having different thicknesses from the other portions and in contact with the first and second side surfaces 212 and 222 respectively of the first and second solder bumps 210 and 220 may be formed in the bottom portion 302 of the resin layer 300, as illustrated in FIG. 2I, by controlling process conditions of transfer molding, and an injection position, an injection direction, an injection speed, an injection viscosity, and the like of the resin material. The first and second thickness variation portions 312 and 322 may be formed in various forms by adjusting a shape, a structure, and/or a material of the molding tape MT. In an example embodiment, the first and second thickness variation portions 312 and 322 may be formed by adjusting a force pressing against the molding tape MT. The molding tape MT may be attached to the first and second solder bumps 210 and 220 and pressed so that end portions of the first and second solder bumps 210 and 220 are buried in the adhesive layer. Thereafter, when the pressing force is released, the molding tape MT partially returns to an original position of the molding tape MT before the pressing force is applied thereto due to an elastic force of the molding tape MT, but the adhesive layer having a large viscosity may be deformed and attached to the first and second side surfaces 212 and 222 of the first and second solder bumps 210 and 220 without returning to the position before the pressing force is applied. Accordingly, a portion of the adhesive layer attached to the first and second side surfaces 212 and 222 of the first and second solder bumps 210 and 220 expands, and thus first and second inclined surfaces rising along the first and second side surfaces 212 and 222, respectively, of the first and second solder bumps 210 and 220 may be formed. As described above, when the resin material RM is injected through a transfer molding process to cover the first and second side surfaces 212 and 222 of the first and second solder bumps 210 and 220 in a state in which the first and second inclined surfaces are formed in the adhesive layer, the first and second thickness variation portions 312 and 322 having different thicknesses from the other portions of the resin layer may be formed at portions in which the inclined surfaces are formed. The first and second thickness variation portions 312 and 322 may be formed as first and second inclined surfaces having a decreased thickness while being inclined toward the second surface 100a of the bump chips 100 near the first and second side surfaces 212 and 222 of the first and second solder bumps 210 and 220. The first and second inclined surfaces formed by the first and second thickness variation portions 312 and 322 may be molded to have a curved surface shape which is convexly curved toward the first and second side surfaces 212 and 222 of the first and second solder bumps 210 and 220. According to this shape, the first and second solder bumps 210 and 220 may be formed so as to expand in a direction along the first and second thickness variation portions 312 and 322, respectively, of the resin layer 300 when reflowing, and thus a shape of the solder bump after curing may be adjusted to be a suitable shape having a relatively large contact area and a small area in which stress is concentrated.

Figure 4G:
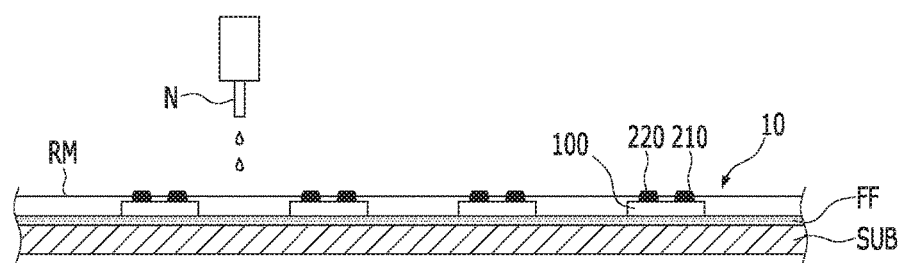

The first and second thickness variation portions 312 and 322 may be formed as first and second inclined surfaces having an increased thickness near the first and second side surfaces 212 and 222, respectively, of the first and second solder bumps 210 and 220. In an example embodiment, the resin layer 300 may be formed by injecting a liquid resin material between the bump chips 100 by dispensing, and a portion of the bottom portion 302 of the resin layer 300 may rise along the first and second side surfaces 212 and 222 of the first and second solder bumps 210 and 220 by surface tension, as illustrated in FIG. 2H, and thus the first and second thickness variation portions 312 and 322 may be formed to have meniscus-shaped inclined surfaces which are concavely curved along the shapes of the first and second side surfaces 212 and 222, respectively, of the first and second solder bumps 210 and 220. Accordingly, adhesion between the resin layer 300 and the first and second solder bumps 210 and 220 may be improved. When the first and second thickness variation portions 312 and 322 are formed by dispensing, an application thickness of the liquid resin material supplied between the bump chips 100 through a nozzle N may be adjusted to be smaller than a protruding thickness T1 of each of the first and second solder bumps 210 and 220, as illustrated in FIG. 4G, so that a shape of the resin layer 300 obtained after heating and curing processes may be formed to have the shape illustrated in FIG. 2H.

Referring to FIG. 4C, the resin layer 300 is cured by a thermal process in step S05. Referring to FIG. 4D, after the resin layer 300 is cured, the molding tape MT is removed and the packaged bump chips 100 are separated through a cutting or sawing process using a blade B in step S06, and thus a plurality of semiconductor LED packages 20 each having the structure illustrated in FIGS. 2A to 2I may be obtained.

According to an example embodiment, step S01 of FIG. 4A may be replaced by step S01' of FIG. 4E in which a resin material EC such as a silicone resin or the like is applied to the phosphor film FF at regular intervals and the bump chips 100 are arranged on the resin material EC and the resin material EC is cured by a thermal process and the steps shown in FIGS. 4B to 4D may be performed such that a plurality of semiconductor LED packages 20 having the structure illustrated in FIGS. 2F and 2G in which an inclined surface 308 is formed on an inner side surface of the resin layer 300 and the resin material EC is filled along the inclined surface 308 may be obtained.

FIGS. 5A to 5F are views schematically illustrating a process of manufacturing a semiconductor LED package 20 according to an example embodiment of the present inventive concept, and illustrate an example of the process of manufacturing the semiconductor LED package 20 including an extension portion 304a using a phosphor film FF.

Figure 5A:
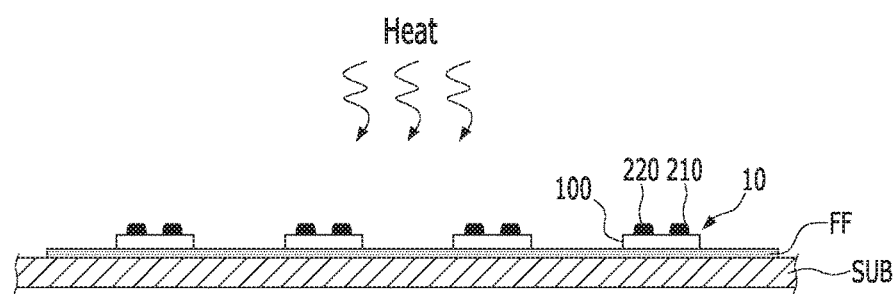

Referring to FIG. 5A, steps S11 and S12 in which a plurality of bump chips 100 are arranged on the phosphor film FF and heated and cured may be the same as steps S01 and S02.

Figure 5B:
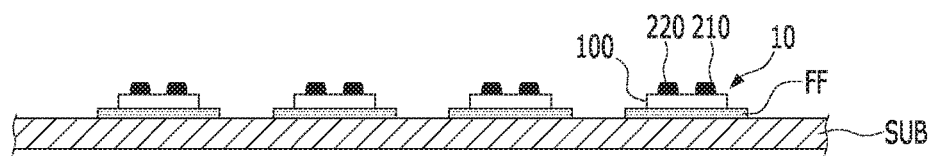
Figure 5C:
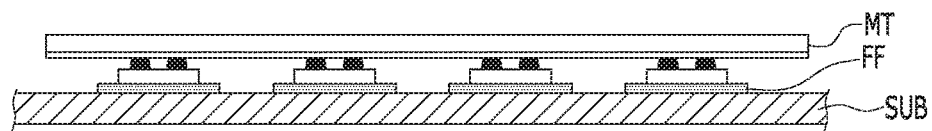
Figure 5D:
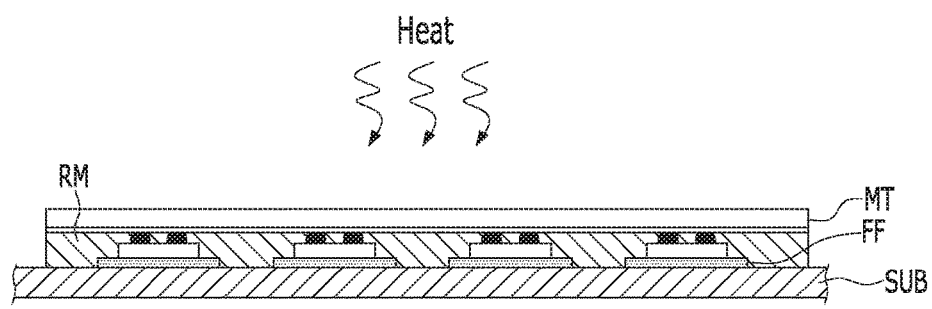

Referring to FIGS. 5B to 5D, in step S13, a portion of the phosphor film FF located between the plurality of bump chips 100 may be removed. In step S14 shown in FIG. 4C, a molding tape MT may be attached on the plurality of bump chips 100 in the same manner as in step S03 of FIG. 4B. In step S15, the entire substrate SUB may be located inside a mold MD in a state in which the plurality of bump chips 100 to which the molding tape MT is attached are mounted on the phosphor film FF in the same manner as in step S04 illustrated in FIGS. 4C and 4F, and a resin layer 300 may be molded by injecting a resin material RM thereinto through a transfer molding process. Since the portion of the phosphor film FF located between the bump chips 100 is removed, the resin material RM is also injected into this portion, and thus an extension portion 304a of a side wall portion 304 of the resin layer 300 covering side surfaces of the phosphor film FF may be formed. The resin layer 300 in which the extension portion 304a is molded may be cured by a thermal process.

Figure 5E:
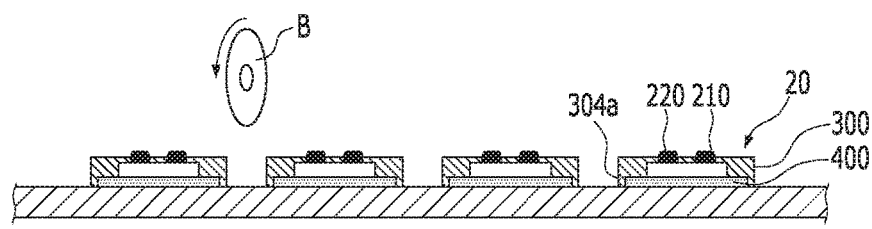

Referring to FIG. 5E, in step S16, the molding tape MT is removed, the packaged bump chips 100 are separated by a blade B through a cutting or sawing process, and thus a plurality of semiconductor LED package 20 having the structure illustrated in FIG. 2E may be obtained.

Figure 5F:
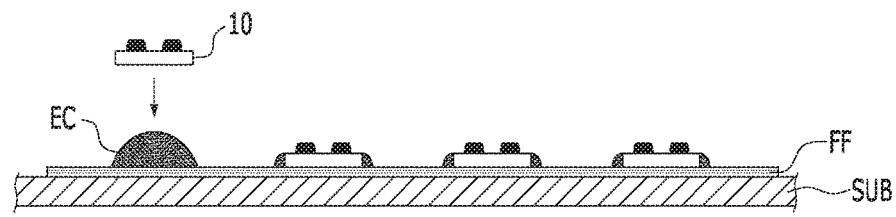

According to an example embodiment, step S11 of FIG. 5A may be replaced by step S11' of FIG. 5F in which a resin material EC such as a silicone resin or the like is applied to the phosphor film FF at regular intervals and the bump chips 100 are arranged on the resin material EC and the resin material EC is cured by a thermal process and the steps shown in FIGS. 5B to 5E may be performed such that a plurality of semiconductor LED packages 20 having the structure illustrated in FIG. 2G in which the resin material EC fills the inner inclined surface 308 of the resin layer 300 and the extension portion 304a is formed in the side wall portion 304 may be obtained.

FIGS. 6A to 6E are views schematically illustrating a process of manufacturing a semiconductor LED package 20 according to an example embodiment, and illustrate an example of the process of manufacturing the semiconductor LED package 20 using an adhesive tape AT.

Figure 6A:
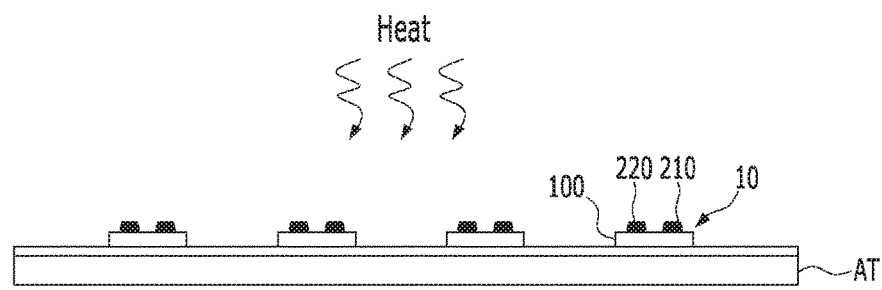
Figure 6B:
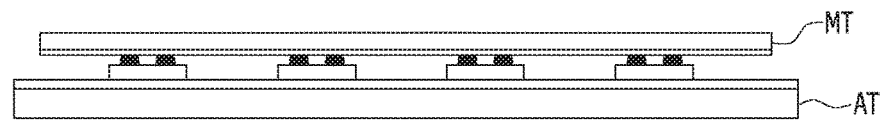

Referring to FIGS. 6A and 6B, in step S21, a plurality of bump chips 100 may be arranged and attached on the adhesive tape AT at regular intervals. In step S22, the adhesive tape AT may be cured through a thermal process. In step S23, a molding tape MT may be attached to the plurality of bump chips 100 arranged on the adhesive tape AT in the same manner as in step S03 of FIG. 4B.

Figure 6C:
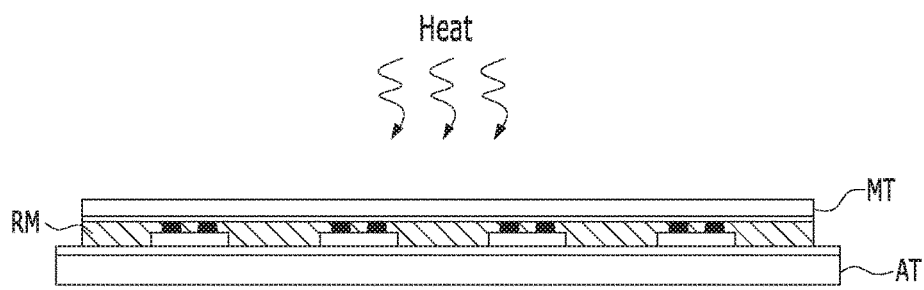

Referring to FIG. 6C and FIG. 4F, in step S24, the plurality of bump chips 100 to which the molding tape MT is attached may be disposed inside a mold MD while being mounted on the adhesive tape AT, a resin material RM may be injected thereinto through a transfer molding process, as illustrated in FIG. 4F, and thus a resin layer 300 may be molded to have the shape illustrated in FIGS. 2A to 2I. After the resin layer 300 is molded, the resin layer 300 may be cured through a thermal process as shown in FIG. 6C.

Figure 6D:
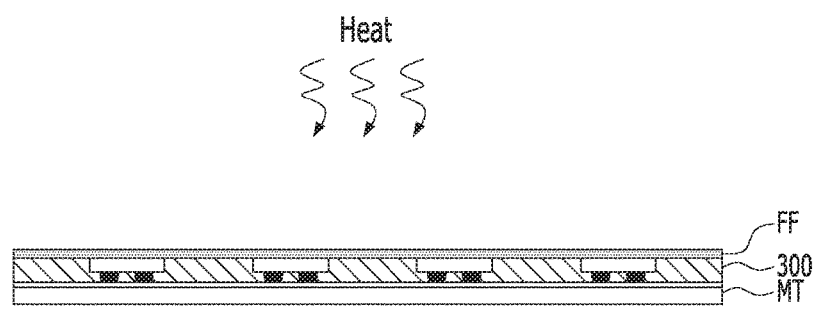

Referring to FIG. 6D, in step S25, after the plurality of bump chips 100 in which the resin layer 300 is molded are transferred in a form of being stacked on the molding tape MT, the adhesive tape AT may be removed. In step S26, a phosphor film may be stacked on the resin layer 300 or a liquid phosphor may be applied by being dispensed in a form that covers the plurality of bump chips 100. The phosphor may be cured by a thermal process.

Figure 6E:
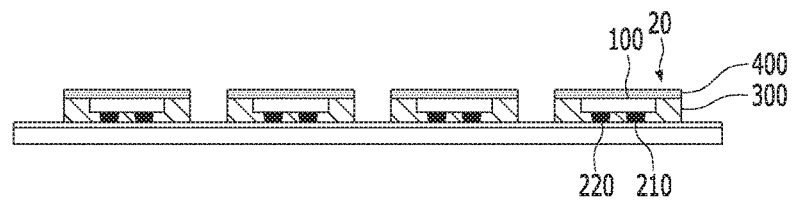

Referring to FIG. 6E, in step S26, the packaged bump chips 100 are separated through a cutting or sawing process, and thus a plurality of semiconductor LED packages 20 having the structure illustrated in FIGS. 2A to 2D may be obtained.

Figure 6F:
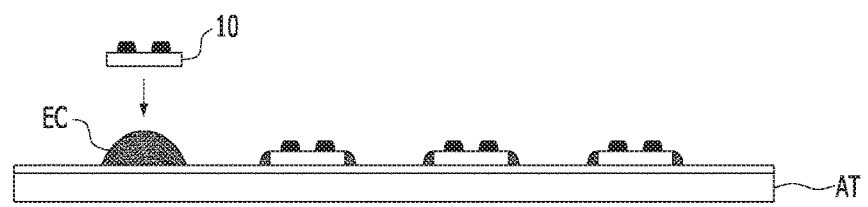

According to an example embodiment, step S21 of FIG. 6A may be replaced by step S21' of FIG. 6F in which a resin material EC such as a silicone resin or the like is applied to the phosphor film FF at regular intervals and the bump chips 100 are arranged on the resin material EC and the resin material EC is cured by a thermal process and the steps shown in FIGS. 5B to 5E may be performed such that a plurality of semiconductor LED packages 20 having the structure illustrated in FIG. 2F in which the resin material EC fills the inner inclined surface 308 of the resin layer 300 may be obtained.

Figure 7:
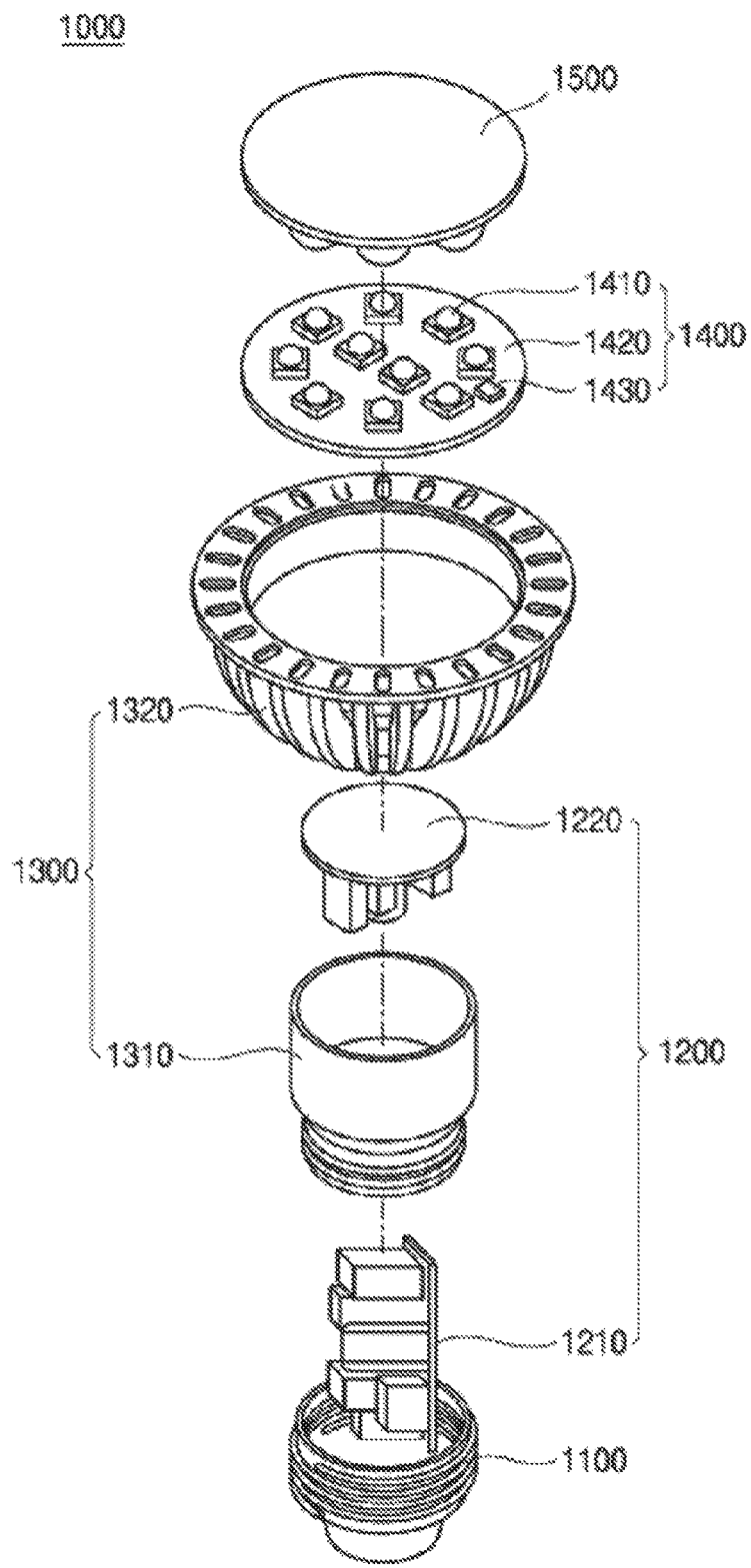
FIG. 7 is a view illustrating an example in which the semiconductor LED package (10 or 20) according to an example embodiment is applied to a lighting device which is an example of a light-emitting device.

FIG. 7 is a view schematically illustrating an example in which the semiconductor LED package 10 or 20 according to an example embodiment is applied to a lighting device which is an example of a light-emitting device.

Referring to FIG. 7, a lighting device 1000 may include a socket 1100, a power supply 1200, a heat dissipation unit 1300, a light source module 1400, and an optical unit 1500. In an example embodiment, the light source module 1400 may include an LED array, and the power supply 1200 may include an LED driver.

The socket 1100 may be configured to be replaced by an existing lighting device. Power supplied to the lighting device 1000 may be applied thereto through the socket 1100. The power supply 1200 may be divided into a first power supply 1210 and a second power supply 1220 and assembled.

The heat dissipation unit 1300 may include an internal heat dissipation unit 1310 and an external heat dissipation unit 1320. The internal heat dissipation unit 1310 may be directly connected to the light source module 1400 and/or the power supply 1200, and heat may be transferred to the external heat dissipation unit 1320 through the internal heat dissipation unit 1310. The optical unit 1500 may include an internal optical unit (not illustrated) and an external optical unit (not illustrated), and may be configured to uniformly disperse light emitted by the light source module 1400.

The light source module 1400 may receive power from the power supply 1200 and emit light toward the optical unit 1500. The light source module 1400 may include one or more LEDs 1410, a circuit board 1420, and a controller 1430. The controller 1430 may be configured to store driving information of the LEDs 1410. The LEDs 1410 may include the semiconductor LED package 10 or 20 according to example embodiments of the present inventive concept. The semiconductor LED package 10 or 20 may be directly mounted on a conductive pad formed in a light-emitting device, or may be mounted on a device in the form of a module mounted on a sub board or a circuit board.

Figure 8:
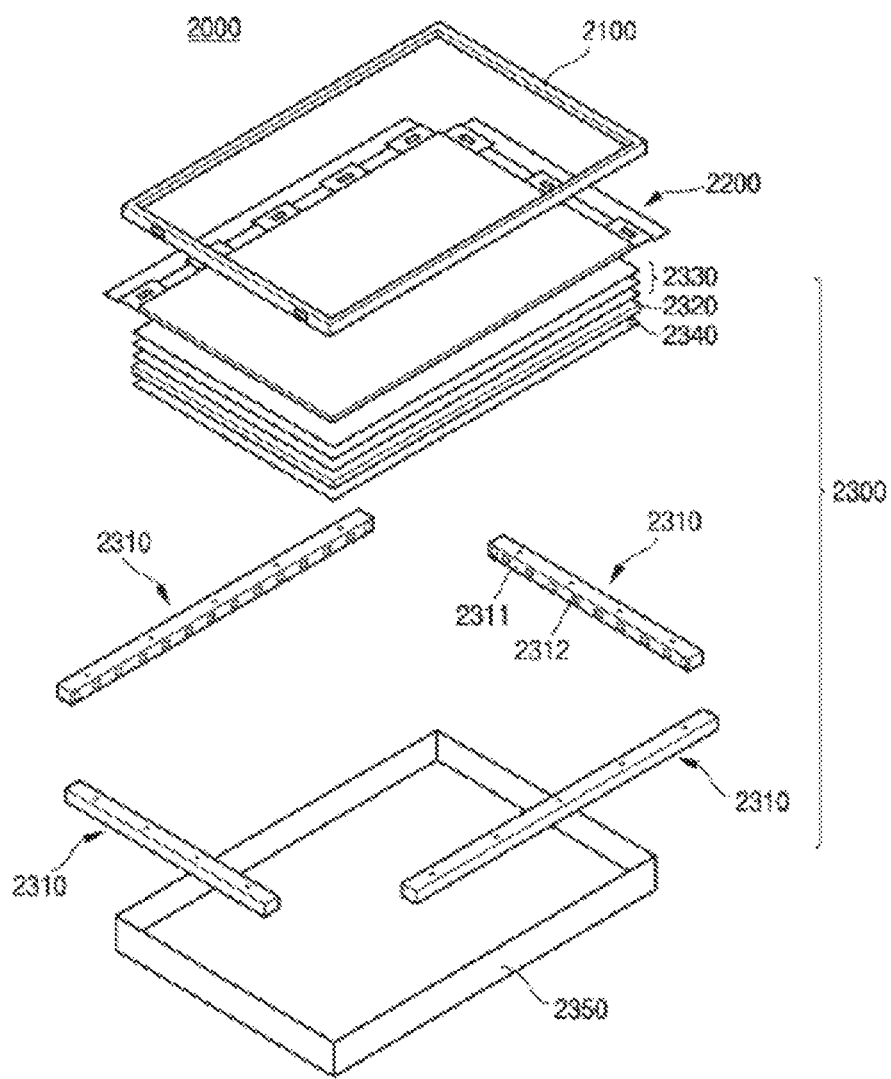
FIG. 8 is a view illustrating an example in which the semiconductor LED package (10 or 20) according to an example embodiment is applied to a liquid crystal display (LCD) device which is an example of a light-emitting device.

FIG. 8 is a view illustrating an example in which the semiconductor LED package 10 or 20 according to an example embodiment of the present inventive concept is applied to a liquid crystal display (LCD) device which is an example of a light-emitting device.

Referring to FIG. 8, an LCD device 2000 may include a front case 2100, a liquid crystal panel 2200, and a backlight unit 2300. The backlight unit 2300 may include a light source module 2310, a light guide plate 2320, an optical sheet 2330, a reflective sheet 2340, and a frame 2350. The light source module 2310 may include a substrate 2311 and a light source 2312 mounted on the substrate 2311. The light source 2312 may include the semiconductor LED package 10 or 20 according to an example embodiment of the present inventive concept. The light guide plate 2320, the optical sheet 2330, and the reflective sheet 2340 may be disposed at a side portion of a light path of the light source 2312. The backlight unit 2300 illustrated in FIG. 8 is configured as an edge type backlight unit, but may be configured as a direct type backlight unit.

In an example embodiment, the semiconductor LED package 10 or 20 may be applied as an internal or external light source for a vehicle. An interior light, a reading light, and various light sources of a dashboard for a vehicle may be used as the internal light source, and a head light, a brake light, a turn signal light, a fog light, a driving light, and the like may be used as the external light source. In an example embodiment, the semiconductor LED package 10 or 20 may be applied as a light source used in a robot or various types of mechanical equipment. In an example embodiment, the semiconductor LED package 10 or 20 may be applied to various optical communication devices using light.

In an example embodiment, when a specific wavelength band of the semiconductor LED package 10 or 20 is used, plant growth may be promoted, and a person's mood may be stabilized or a disease of the person may be treated. In an example embodiment, in conjunction with low power consumption and a long lifetime of the semiconductor LED package 10 or 20, lighting by an ecologically friendly renewable energy system such as a solar cell system, a wind power system, and the like may be implemented.

In example embodiments of the present inventive concept, since the semiconductor LED packages 10 and 20 and the process of manufacturing the same described with reference to FIGS. 1A to 6F are applied to various light-emitting devices, a process cost of the various light-emitting devices may be lowered, light efficiency may be increased, and thus performance per price of various products to which the semiconductor LED package 10 or 20 is applied may be significantly improved.

According to the present inventive concept, a semiconductor LED package in which a production cost is reduced, a manufacturing yield is improved, and manufacturing/mounting processes are significantly simplified can be provided.

While example embodiments of the present inventive concept have been described with reference to the accompanying drawings, it should be understood by those skilled in the art that various modifications may be made without departing from the scope of the present inventive concept and without changing essential features thereof. Therefore, the above-described example embodiments should be considered in a descriptive sense only and not for purposes of limitation.

What is claimed is:

1. A semiconductor light-emitting diode (LED) package comprising:
a semiconductor LED chip comprising first electrode and a second electrode provided on a surface of the semiconductor LED chip;
a first solder bump provided on the first electrode and a second solder bump provided on the second electrode, the first solder bump and the second solder bump protruding from the surface of the semiconductor LED chip; and a resin layer comprising a bottom portion that surrounds a first side surface of the first solder bump and a second side surface of the second solder bump and covers the surface of the semiconductor LED chip except for the first solder bump and the second solder bump, wherein the bottom portion of the resin layer includes a first variation portion which is in contact with the first side surface and a second variation portion which is in contact with the second side surface, and the first variation portion has a first variation portion thickness and the second variation portion has a second variation portion thickness, and the first variation portion thickness and the second variation portion thickness are each different from a thickness of a remaining portion of the bottom portion of the resin layer.

2. A semiconductor light-emitting diode (LED) package comprising:

a semiconductor LED chip comprising first electrode and a second electrode provided on a surface of the semiconductor LED chip;

a first solder bump provided on the first electrode and a second solder bump provided on the second electrode, the first solder bump and the second solder bump protruding from the surface of the semiconductor LED chip; and a resin layer comprising a bottom portion that surrounds a first side surface of the first solder bump and a second side surface of the second solder bump and covers the surface of the semiconductor LED chip, wherein the bottom portion of the resin layer includes a first variation portion which is in contact with the first side surface and a second variation portion which is in contact with the second side surface, and the first variation portion has a first variation portion thickness and the second variation portion has a second variation portion thickness, and the first variation portion thickness and the second variation portion thickness are each different from a thickness of a remaining portion of the bottom portion of the resin layer, wherein the first variation portion includes a first inclined surface having a first inclined surface thickness and a first curved surface which is convex toward the first side surface of the first solder bump near the first side surface, and the second variation portion includes a second inclined surface having a second inclined surface thickness and a second curved surface which is convex toward the second side surface of the second solder bump near the second side surface, and wherein the first inclined surface thickness is less than the first variation portion thickness and the second inclined surface thickness is less than the second variation portion thickness.

3. The semiconductor LED package of claim 1, wherein the first solder bump and the second solder bump each protrudes from the surface of the semiconductor LED chip, and a first bump thickness of the first solder bump with respect to the surface and a second bump thickness of the second solder bump with respect to the surface each ranges from about 60 µm to about 100 µm.

4. The semiconductor LED package of claim 1, wherein the first solder bump includes a first flat upper surface and the first side surface that together comprise a first inclined convex surface, the second solder bump includes a second flat upper surface and the second side surface that together comprise a second inclined convex surface;

a first base end of the first side surface is surrounded by the bottom portion of the resin layer and a second base end of the second side surface is surrounded by the bottom portion of the resin layer, and a first front end of the first side surface is configured as a first protruding portion that protrudes from the bottom portion, and a second front end of the second side surface is configured as a second protruding portion that protrudes from the bottom portion.

5. The semiconductor LED package of claim 4, wherein a thickness of each of the first protruding portion and the second protruding portion ranges from about 5 µm to about 50 µm.

6. The semiconductor LED package of claim 1, wherein a first bump thickness of the first solder bump from the surface and a second bump thickness of the second solder bump from the surface are substantially uniform, or a first upper surface of the first solder bump and a second upper surface of the second solder bump are substantially coplanar.

7. The semiconductor LED package of claim 1, wherein the first solder bump and the second solder bump are Sn—Ag—Cu (SAC) solder comprising Sn, Ag, and Cu components.

8. The semiconductor LED package of claim 1, wherein the bottom portion fills a space between the first solder bump and the second solder bump.

9. The semiconductor LED package of claim 1, further comprising a wavelength conversion layer configured to convert a wavelength of light emitted from the semiconductor LED chip, wherein the resin layer is formed of a same material as the wavelength conversion layer, and the wavelength conversion layer and the resin layer are integrally coupled and fully cover or surround the semiconductor LED chip.

10. The semiconductor LED package of claim 1, further comprising a wavelength conversion layer configured to convert a wavelength of light emitted from the semiconductor LED chip, wherein the resin layer is formed of a light reflective material which reflects the light, the resin layer includes a side wall portion which extends from the bottom portion to cover or surround a side surface of the semiconductor LED chip, and the wavelength conversion layer is provided on the side wall portion and covers the semiconductor LED chip.

11. The semiconductor LED package of claim 10, wherein the side wall portion further includes an extension portion that extends from an edge of the side wall portion toward the wavelength conversion layer and covers a conversion layer side surface of the wavelength conversion layer, and the wavelength conversion layer is inserted into the extension portion and covers the semiconductor LED chip.

12. The semiconductor LED package of claim 10, wherein an inclined surface facing the semiconductor LED chip and having a diameter that increases as the inclined surface approaches the wavelength conversion layer is formed on an inner side surface of the side wall portion, and an angle of the inclined surface ranges from about 40° to about 65°.

13. The semiconductor LED package of claim 12, further comprising a resin material that fills a space between the inclined surface and the semiconductor LED chip.

14. The semiconductor LED package of claim 1, wherein at least one of the first side surface of the first solder bump and the second side surface of the second solder bump includes at least one concave portion which is inwardly concave, and the resin layer fills the at least one concave portion.

15. A semiconductor light-emitting diode (LED) package comprising:

a semiconductor LED chip comprising first electrode and a second electrode provided on a surface of the semiconductor LED chip;

a first solder bump provided on the first electrode and a second solder bump provided on the second electrode, the first solder bump and the second solder bump protruding from the surface of the semiconductor LED chip; and a resin layer comprising a bottom portion that surrounds a first side surface of the first solder bump and a second side surface of the second solder bump and covers the surface of the semiconductor LED chip, wherein the bottom portion of the resin layer includes a first variation portion which is in contact with the first side surface and a second variation portion which is in contact with the second side surface, and the first variation portion has a first variation portion thickness and the second variation portion has a second variation portion thickness, and the first variation portion thickness and the second variation portion thickness are each different from a thickness of a remaining portion of the bottom portion of the resin layer, wherein the first variation portion includes a first inclined surface having a first inclined surface thickness that is greater than the first variation portion thickness, and a first inner side surface which is concavely curved along a shape of the first side surface near the first side surface, and wherein the second variation portion includes a second inclined surface having a second inclined surface thickness that is greater than the second variation portion thickness and a second inner side surface which is concavely curved along a shape of the second side surface near the second side surface.

16. The semiconductor LED package of claim 1, wherein the semiconductor LED chip includes an insulating layer that surrounds the first electrode and the second electrode and electrically separates the first electrode and the second electrode, a portion of the insulating layer defines an opening region, protrudes from a first surface of the first electrode and from a second surface of the second electrode, and exposes the first surface and the second surface, and the first solder bump and the second solder bump are provided in the opening region.

17. The semiconductor LED package of claim 1, wherein bottoms of the first solder bump and the second solder bump are lower than a lowermost portion of the resin layer.

* * * * *